United States Patent
Okayasu et al.

(10) Patent No.: US 6,769,082 B1
(45) Date of Patent: Jul. 27, 2004

(54) DELAY DEVICE, SEMICONDUCTOR TESTING DEVICE, SEMICONDUCTOR DEVICE, AND OSCILLOSCOPE

(75) Inventors: Toshiyuki Okayasu, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/436,361

(22) Filed: Nov. 9, 1999

(30) Foreign Application Priority Data

Mar. 15, 1999 (JP) ............................................ 11-067815

(51) Int. Cl.[7] .......................... G01R 31/28; G06F 31/00
(52) U.S. Cl. ...................................... 714/738; 714/736
(58) Field of Search ................................. 714/724, 758, 714/733, 738, 719, 735, 742

(56) References Cited

U.S. PATENT DOCUMENTS

| 5,127,011 A | * | 6/1992 | Combs et al. ............... 714/740 |
| 5,854,797 A | * | 12/1998 | Schwartz et al. ........... 714/724 |
| 6,201,746 B1 | * | 3/2001 | Koo et al. ................... 365/201 |

FOREIGN PATENT DOCUMENTS

| EP | 0 797 303 A2 | 9/1997 |
| GB | 2 328 570 A | 2/1999 |
| KR | 1994-0005004 | 10/1992 |

OTHER PUBLICATIONS

South Korean Official Action, Aug. 27, 2001 (2 pages), with partial translation (3 pages).
German Official Action, Aug. 22, 2001 (4 pages), with English translation (4 pages).
T.F. Knight, Jr. and Alexander Krymm, "A Self–Terminating Low–Voltage Swing CMOS Output Driver," IEEE Journal of Solid–State Circuits, vol. 23, No. 2, Apr. 1988, pp. 457–464.

* cited by examiner

*Primary Examiner*—Albert Decady
*Assistant Examiner*—Mujtaba Chaudry
(74) *Attorney, Agent, or Firm*—Osha & May L.L.P.

(57) ABSTRACT

To enhance the accuracy of the delay time of the delay device by reducing the change in the power supply voltage for the delay device, and a delay device that delays an incoming transmission signal, comprising: a delay element that operates on a power supply voltage Vdd and a power supply voltage Vss and delays the transmission signal, the voltage Vdd being larger than the voltage Vss; an addition circuit that outputs to an output of the delay element, a predetermined voltage that is larger than the voltage Vss and smaller than the voltage Vdd. This delay element includes a digital circuit that outputs one of output voltages of two possible values in correspondence with an input voltage. Furthermore, the addition circuit outputs a voltage substantially similar to a threshold voltage that said output of the digital circuit inverts from one of the output voltages of two possible values to another thereof.

6 Claims, 34 Drawing Sheets

(A)

(B)

(C)

DELAY DEVICE, SEMICONDUCTOR TESTING DEVICE, SEMICONDUCTOR DEVICE, AND OSCILLOSCOPE

This patent application claims priority based on a Japanese patent application, H11-067815 filed on Mar. 15, 1999 the contents of which are incorporated herein by reference.

BACKGROUND OF THE INVENTION

1. Field of the Invention

The present invention relates to a delay device, a semiconductor testing device, a semiconductor device, and an oscilloscope and in particular to a delay device, a semiconductor testing device, a semiconductor device, and an oscilloscope provided with an addition circuit that applies a predetermined voltage to a delay element.

2. Description of the Related Art

FIG. 1 shows the delay device D 12 as a related art. The delay device D12 includes a plurality of delay elements DL in series,with each other. The incoming transmission signal is delayed by each delay element DL producing a delay time of Td.

FIG. 2 shows the current that flows in the delay device D12. Once a unit pulse is fed to the delay device D12 as shown in FIG. 2(A), the current applied to the delay element DL changes to flow in a burst as shown in FIG. 2(B). The period of time during which the current flows is equivalent to the delay time Td. When successive pulses are fed to the delay device D12 as shown in FIG. 2(C), whilst the initial current generated by the first pulse flows, another current generated by the following pulse also flows, as shown in FIG. 2(D). When the current of two or more delay elements DL simultaneously changes in this way, the sum of the current flowing in the delay device D12 changes as shown in FIG. 2(E). Since the change in the current alters the power supply voltage Vdd and Vss of the delay device D12, the accuracy of the delay time Td of the delay device D12 is decreased.

FIG. 3 shows another delay device D12 as a related art. The delay device D12 includes a plurality of selectors SEL in series with each other, and a plurality of delay elements DL each of which delay the incoming transmission signal and feed it to a following selector SEL. The delay element DL has one or more inverters in series with each other. The selector SEL selectively outputs the signal that passes through the delay element DL as well as the signal that does not pass through. The timing of the electric power consumed in the delay device D12 differs depending upon the selection by the selector SEL. For example, if all the selectors SEL select the outputs of the delay elements DL, the transmission signal advances slowly; accordingly, when the selector SEL closest to the output terminal consumes the electric power, the selector SEL closest to the input terminal also consumes the electric power. That is, the electric power is consumed at two or more selectors SEL. The end result is a reduction in accuracy of delay time because the power supply voltage of the delay device D12 differs when the electric power is consumed at two or more selectors SEL compared to when consumed at only one selector SEL.

FIG. 4 shows a circuit electrically equivalent to the delay element DL of FIG. 3. A wiring capacitance CL arises in the signal line LIN that connects the drive circuit DR and the receipt circuit RC while an input capacitance CG arises at the input terminal of the receipt circuit RC. The input capacitance CG is proportional to the number of receipt circuits RC to be connected, while the wiring capacitance CL is proportional to the length of the signal line LIN. If the input capacitance CG and the wiring capacitance CL are increased, permitting the delay device D12 to pass the signal requires a larger current. The increase in the current enlarges the change in the current as shown in FIG. 2(E), thus decreasing the accuracy of the delay time Td.

If the power supply voltage sharply changes due to the operation of the drive circuit DR, an electromagnetic wave noise is radiated. If the change in the power supply current and power supply voltage increases because the signal line LIN is long, the electromagnetic wave noise radiated from the delay device D10 increases also. The electromagnetic wave noise radiated from the electronic instrument must be below a given level, so it is therefore necessary to prevent the electromagnetic wave noise from arising in the electronic instrument provided with the delay device D10.

SUMMARY OF THE INVENTION

It is an object of the present invention to provide a delay device, a semiconductor testing device, a semiconductor device, and an oscilloscope which overcome the drawbacks in the related art. This object is achieved by combinations described in the independent claims. The dependent claims define further advantageous and exemplary combinations of the present invention.

According to an aspect of the present invention, there is provided a delay device that delays an incoming transmission signal, comprising: a delay element that operates on the power supply voltages Vdd and Vss thereby delaying the transmission signal, with the voltage Vdd being larger than the voltage Vss; and an addition circuit that outputs to an output of the delay element, a predetermined voltage which is larger than the voltage Vss and smaller than the voltage Vdd.

Preferably, the delay device further comprises a plurality of delay elements in series with each other; and a plurality of addition circuits each connected to one of outputs of the plurality of delay elements. As an additional preference, the delay device further comprises: a switch unit that outputs one of the outputs of the plurality of delay elements, wherein the addition circuit outputs the predetermined voltage to the output of the switch unit.

It is preferable that the delay element includes a digital circuit that outputs one of output voltages of two possible values in correspondence with an input voltage. The addition circuit should also output a voltage substantially similar to a threshold voltage that the output of the digital circuit inverts from one of the output voltages of two possible values to another thereof.

It is preferable that the addition circuit outputs approximately a midway voltage of the voltage Vss and the voltage Vdd.

It is preferable that the addition circuit has low impedance, smaller than the output impedance of the delay element. More preferably, the output impedance of the addition circuit should range from half to a quarter of the output impedance of the delay element.

It is preferable that the addition circuit includes a first logical gate that inversely outputs an input signal, and a feedback circuit that connects an input terminal of the first logical gate and an output terminal thereof. More preferably, the delay element may include a second logical gate, with the first logical gate having a ratio substantially similar to a ratio of the second logical gate. Similarly, and more preferably, the first logical gate includes one inverter, a NAND gate, and a NOR gate. Similarly, more preferably, the delay element includes a second inverter, with the inverter having a ratio substantially similar to the ratio of the second inverter.

Preferably, the delay device further comprises: a plurality of delay elements in series with each other, and a selector that selects from among the plurality of delay elements one to which the transmission signal is input. The addition circuit outputs a predetermined voltage in response to the input transmission signal which is larger than the voltage Vss and smaller than the voltage Vdd.

Preferably, the delay device further comprises: a plurality of capacitors that store the electric charge of the transmission signal output by the delay element; and a plurality of switches that switch the plurality of capacitors to the output of the delay element. It is more preferable that the capacitor includes the following: a P-type FET where voltage Vdd is applied to a gate of the P-type FET, while at least one of a drain and a source of the P-type FET is connected to the gate, and another thereof is connected to the switch; an N-type FET where the voltage Vss is applied to a gate of the N-type FET, while at least one of a drain and a source of the N-type FET is connected to the gate, and another thereof is connected to the switch.

The capacitor may further include a P-type FET, where the voltage Vdd is applied to a gate of the P-type FET, and the switch switches a drain and a source of the P-type FET to the output of the delay element; an N-type FET, where the voltage Vss is applied to a gate of the N-type FET, and the switch switches a drain and a source of the N-type FET to the output of the delay element; an N-type FET, where the voltage Vss is applied to a drain and a source of the N-type FET, and a gate of the N-type FET is connected to the switch; an N-type FET, where the voltage Vss is applied to a gate of the N-type FET and a substrate, and the switch switches a drain and a source of the N-type FET to the output of the delay element.

The capacitor may still further include a P-type FET, where the voltage Vdd is applied to a gate of the P-type FET and a substrate, and a switch switches a drain and a source of the P-type FET to the output of the delay element; an N-type FET, where the voltage Vss is applied to a drain and source of the N-type FET and a substrate, and a gate of the N-type FET is connected to the switch; and a P-type FET, where the voltage Vdd is applied to a drain and source of the P-type FET and a substrate, and a gate of the P-type FET is connected to the switch.

According to another aspect of the present invention, there is provided a semiconductor testing device that tests a semiconductor device, comprising: a pattern generator that generates a test pattern to be fed into the semiconductor device; a delay unit that generates a delay clock having a delay amount corresponding to an operation characteristic of the semiconductor device; a shaped test pattern generator that generates a shaped test pattern by shaping the test pattern based upon the delay clock; a device insertion unit used for mounting the semiconductor device upon and inputting the shaped test pattern to the semiconductor device; and a comparator that judges whether the semiconductor device is good or not based upon the output signal output by the semiconductor device in response to the shaped test pattern.

The delay unit includes a delay element that operates on two power supply voltages Vss and Vdd with the voltage Vss being smaller than the voltage Vdd. The delay element delays the input clock by the delay amount to generate the delay clock. The delay unit also includes an addition circuit that outputs a predetermined voltage which is larger than the voltage Vss and smaller than the voltage Vdd.

It is preferable that the delay unit further includes a plurality of delay elements in series with each other; and a plurality of addition circuits each connected to one outputs of the plurality of delay elements.

It is preferable that the delay element includes a digital circuit that outputs one of output voltages of two possible values in correspondence with an input voltage. The addition circuit outputs a voltage substantially similar to a threshold voltage that the output of the digital circuit inverts from one of the output voltages of the two possible values to another thereof.

According to further another aspect of the present invention, there is provided a semiconductor device that includes a semiconductor testing unit that tests the semiconductor device, comprising: a semiconductor device unit; and a semiconductor testing unit. The latter includes a delay unit that generates a generation timing of a test pattern used for testing the semiconductor testing unit. This delay unit includes a delay element that operates on two voltages Vdd and Vss with the voltage Vdd being larger than the voltage Vss and generates the timing by delaying the input clock. The delay unit also includes an addition circuit that outputs a predetermined voltage in response to the output of the delay element that is larger than the voltage Vss and smaller than the voltage Vdd.

It is preferable that the delay unit further includes a plurality of delay elements, and a plurality of addition corrects connected to outputs of the plurality of delay elements.

It is preferable that the delay element includes a digital circuit that outputs one of output voltages of two possible values in correspondence with an input voltage. The addition circuit also outputs a voltage substantially similar to a threshold voltage that the output of the digital circuit inverts from one of the output voltages of the two possible values to another thereof.

According to still another aspect of the present invention, there is provided an oscilloscope that visualizes an input signal, comprising: a delay unit that generates a delay clock based upon an input clock; an A/D converter that executes analog/digital conversion on the input signal based upon a timing of the delay clock; a time interpolator that measures as a delay time the time difference between the input of the input signal and output of the delay clock; a processor that generates data used for displaying the input signal based upon data generated by the A/D converter and the delay time; and a display unit that displays the input signal based upon the data generated by the processor.

The delay unit within includes a delay element that operates on two power supply voltages Vss and Vdd which delays the input clock to generate the delay clock, with the voltage Vdd being larger than the voltage Vss. The delay unit also includes an addition circuit that outputs a predetermined voltage which is larger than the voltage Vss and smaller than the voltage Vdd.

It is preferable that the delay unit further includes a plurality of delay elements and a plurality of addition circuits connected to the outputs of the plurality of delay elements. It is more preferable that the delay element includes a digital circuit that outputs one of output voltages of two possible values in correspondence with an input voltage. The addition circuit outputs a voltage substantially similar to a threshold voltage that the output of the digital circuit inverts from one of the output voltages of the two possible values to another thereof.

According to still another aspect of the present invention, there is provided a delay device that delays an incoming transmission signal, comprising: a delay element that operates on power supply voltages Vdd and Vss and delays the transmission signal, with the voltage Vdd being larger than the voltage Vss; and an addition circuit that outputs to an output of the delay element, a predetermined voltage that is larger than the voltage Vss and smaller than the voltage Vdd. The addition circuit includes a P-type FET and an N-type FET. A forward bias voltage is applied to a gate of the P-type FET and a gate of the N-type FET.

Preferably, the delay device further comprises a cutting circuit that cuts off the current flowing between the delay element and the addition circuit.

According to still another aspect of the present invention, there is provided a delay device that delays an incoming transmission signal, comprising: a delay element that operates on power supply voltages Vdd and Vss and delays the transmission signal, with the voltage Vdd being larger than the voltage Vss; and an addition circuit that outputs to an output of the delay element, a predetermined voltage that is larger than the voltage Vss and smaller than the voltage Vdd. The addition circuit includes a voltage source that outputs the predetermined voltage.

It is preferable that the addition circuit further includes a low impedance buffer circuit that lowers the impedance of the voltage output by the voltage source.

Preferably, the delay device further comprises a cutting circuit that cuts off the current flowing between the delay element and the addition circuit.

According to still another aspect of the present invention, there is provided a delay device that delays an incoming transmission signal, comprising: a delay element that operates on power supply voltages Vdd and Vss and delays the transmission signal, with the voltage Vdd being larger than the voltage Vss; and an addition circuit that outputs to an output of the delay element, a predetermined voltage that is larger than the voltage Vss and smaller than the voltage Vdd. The addition circuit includes a NAND gate and a feedback circuit that connects an input terminal of the NAND gate to an output terminal thereof.

It is preferable that the NAND gate includes a control terminal that is fed with a control signal that cuts off current flowing between the delay element and the addition circuit, and current flowing in the addition circuit.

According to still another aspect of the present invention, there is provided a delay device that delays an incoming transmission signal, comprising: a delay element that operates on power supply voltages Vdd and Vss and delays the transmission signal, with the voltage Vdd being larger than the voltage Vss; and an addition circuit that outputs to an output of the delay element, a predetermined voltage that is larger than the voltage Vss and smaller than the voltage Vdd. The addition circuit includes a NOR gate, and a feedback circuit that connects an input terminal of the NOR gate to an output terminal thereof.

It is preferable that the NOR gate has a control terminal that is fed with a control signal that cuts off current flowing between the delay element and the addition circuit, and current flowing in the addition circuit.

According to still another aspect of the present invention, there is provided a delay device that delays an incoming transmission signal, comprising: a delay element that operates on power supply voltages Vdd and Vss and delays the transmission signal, with the voltage Vdd being larger than the voltage Vss; and an addition circuit that outputs to an output of the delay element, a predetermined voltage that is larger than the voltage Vss and smaller than the voltage Vdd. The addition circuit is connected to an end of the delay element.

BRIEF DESCRIPTION OF THE DRAWINGS

The present invention will be understood more fully from the detailed description given below, in conjunction with the accompanying drawings.

DETAILED DESCRIPTION OF THE INVENTION

The invention will now be described based on the preferred embodiments. This does not intend to limit the scope of the present invention, but exemplify the invention. All of the features and the combinations thereof described in the embodiments are not necessarily essential to the invention.

Figure 5:
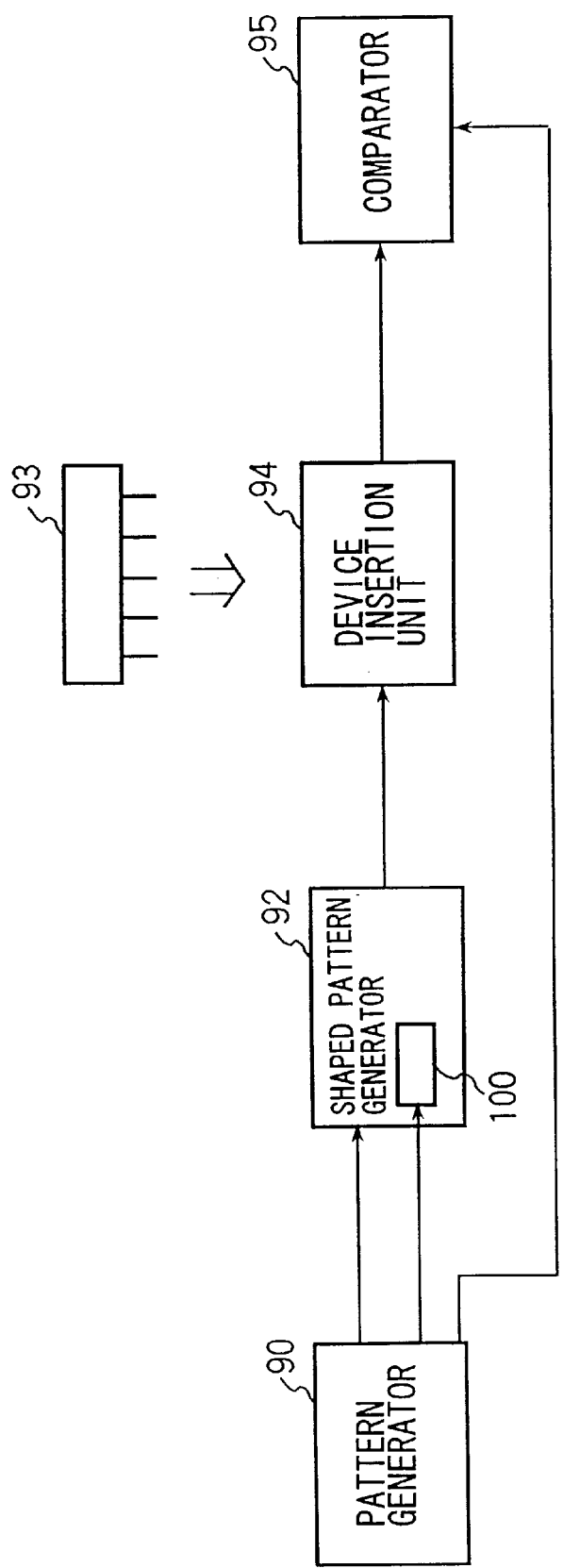
FIG. 5 shows the semiconductor testing device according to the present invention.

FIG. 5 is a block diagram showing an embodiment of the semiconductor testing device. The semiconductor testing device comprises a pattern generator 90, a shaped pattern generator 92, a device insertion unit 94, and a comparator 95. The shaped pattern generator 92 includes a delay circuit 100.

The semiconductor device 93 is inserted in the device insertion unit 94. The pattern generator 90 generates pattern data that is fed to semiconductor device 93 and expectation data that the semiconductor device 93 should output in response to the pattern data. The pattern generator 90 outputs the pattern data to the shaped pattern generator 92 and the expectation data to the comparator 95. Further, the pattern generator 90 outputs a timing set signal to the delay circuit 100 to instruct it to generate a delay clock having a predetermined delay amount in correspondence with the operation characteristic of the semiconductor device 93.

The delay circuit 100 generates a delay clock that has a delay amount designated by the timing set signal. The shaped pattern generator 92 shapes the pattern data on the basis of the delay clock provided by the delay circuit 100. The shaped pattern generator 92 outputs to the device insertion unit 94 the shaped pattern data corresponding to the operation characteristic of the semiconductor device 93. In response to the shaped pattern data, the semiconductor device 93 outputs a signal to the comparator 95. The comparator 95 judges whether the semiconductor device 93 is good or not by comparing this signal and the expectation data.

Figure 6:
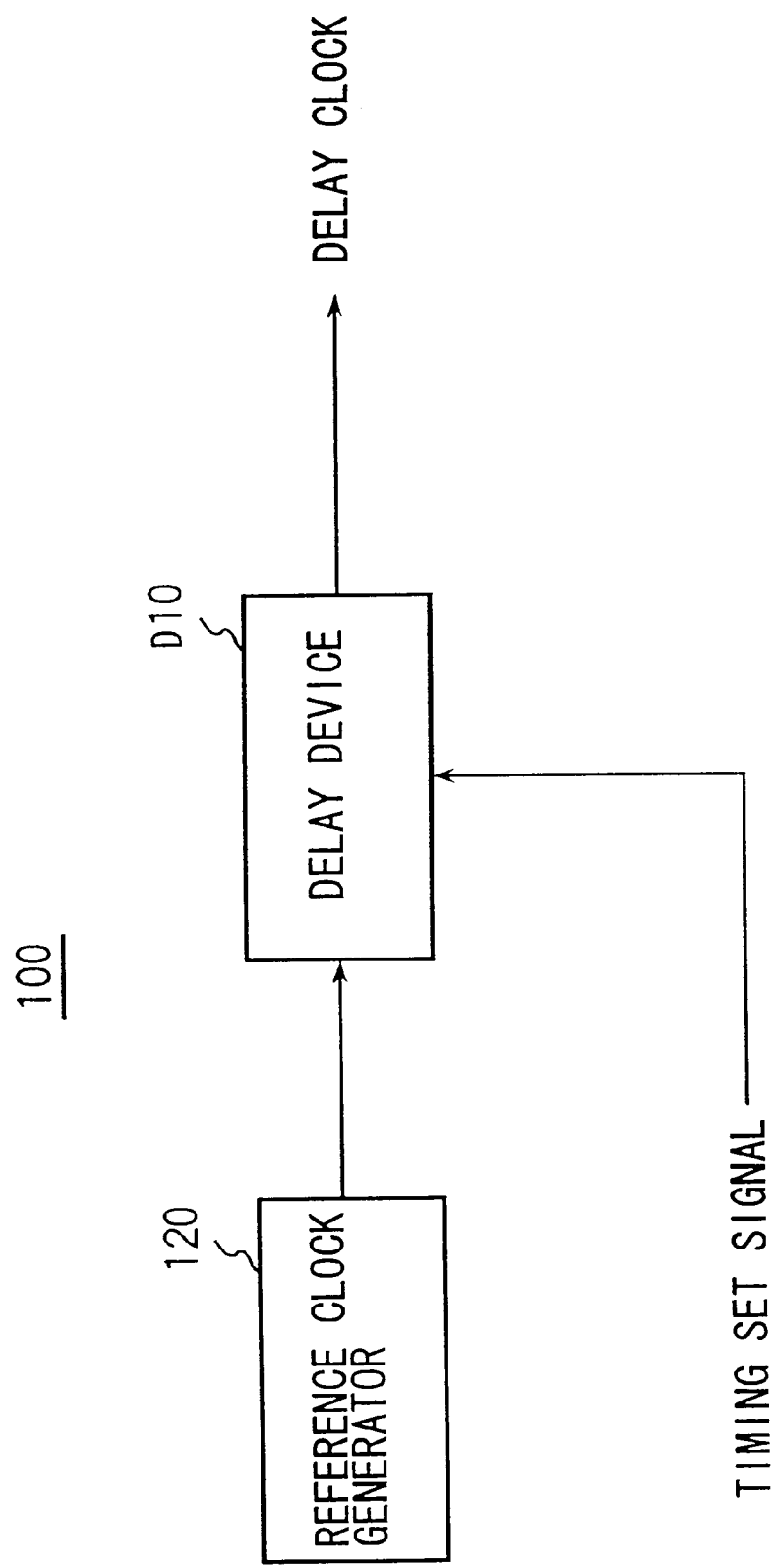
FIG. 6 shows the structure of the delay circuit 100 of FIG. 5.

FIG. 6 shows the structure of the delay circuit 100. The delay circuit 100 comprises a reference clock generator 120 and a delay device D10. The reference clock generator 120 generates a reference clock. The delay device D10 is fed with the reference clock data. The delay device D10 also receives the timing set signal from the pattern generator 90. The delay device D10 delays the reference clock by the delay amount specified by the timing set signal, thereby generating the delay clock.

Figure 1:
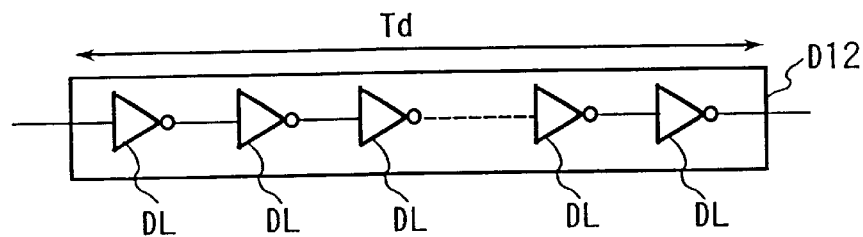
FIG. 1 shows a related art of the delay device D12.
Figure 2:
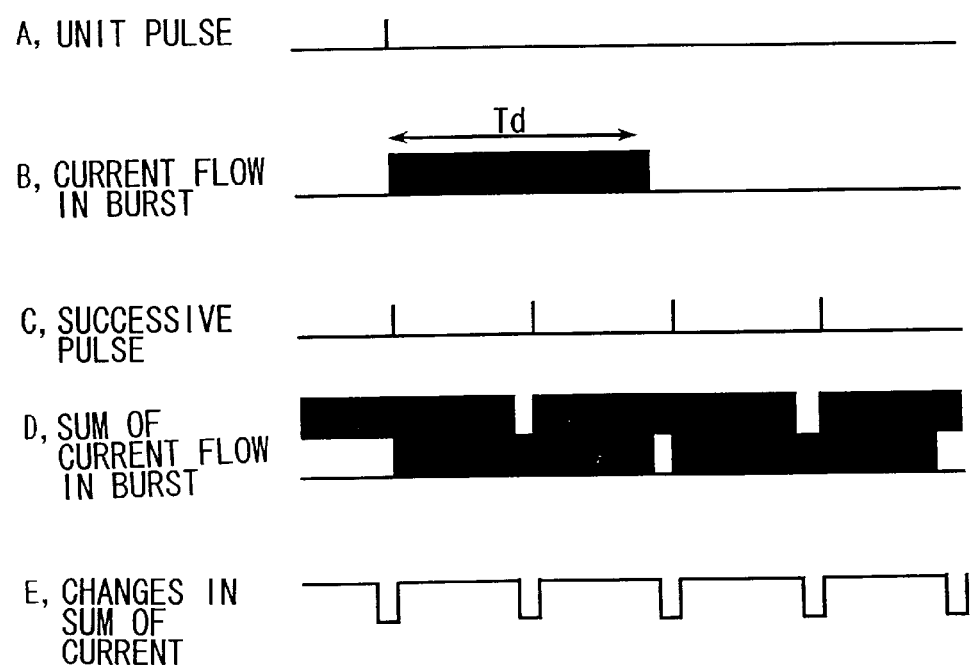
FIG. 2 shows the waves of the signals for the delay device D12 of FIG. 1.
Figure 3:
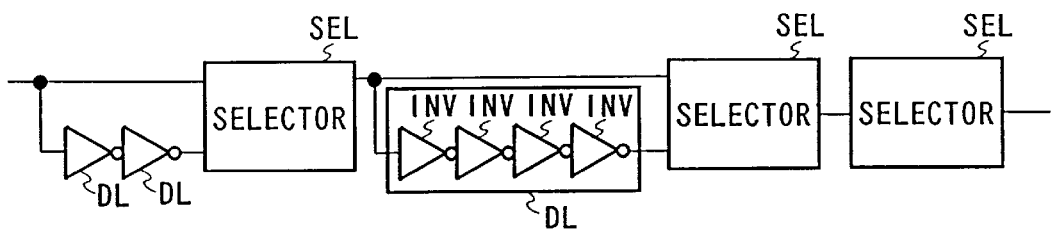
FIG. 3 shows another related art of the delay device D12.
Figure 4:
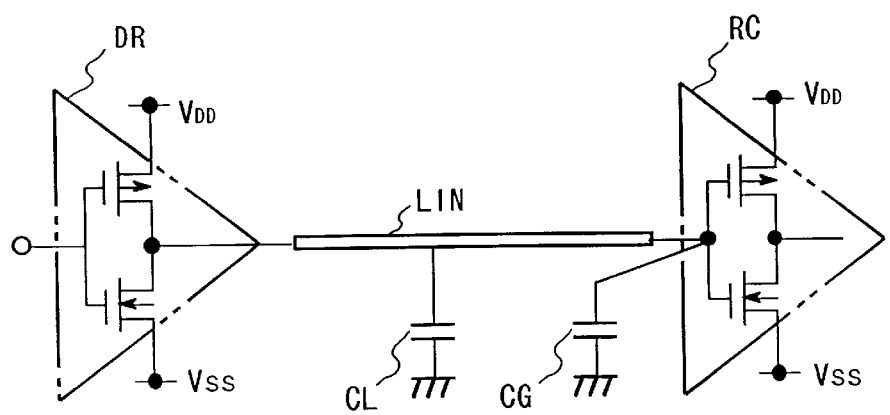
FIG. 4 shows the circuit electrically equivalent to the delay circuit D12.
Figure 7:
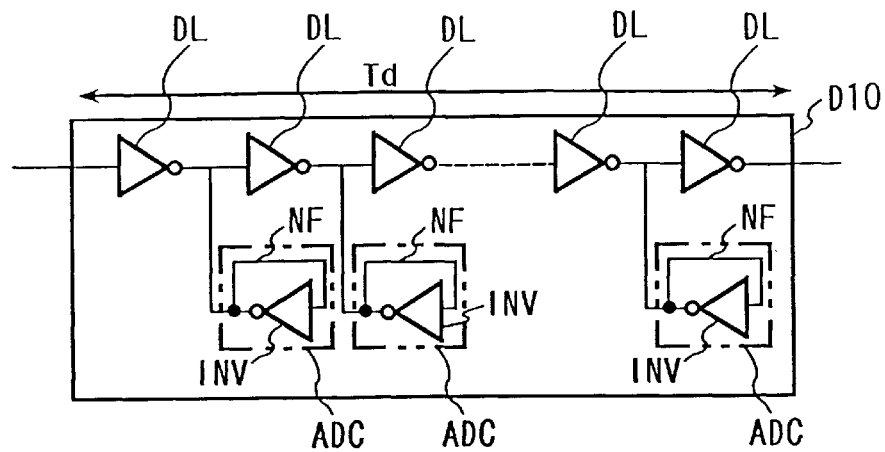
FIG. 7 shows the structure of the delay device D10 used for the delay circuit 100.

FIG. 7 shows the structure of the delay device D10 used for the delay circuit 100 of FIG. 5. In comparison with FIG. 1, FIG. 7 shows the delay device D10 without the circuit that controls the delay time based upon the timing set signal. The delay device D10 includes a plurality of delay elements DL in series with each other, and a plurality of addition circuits ADC connected to the respective outputs of the delay elements DL. The addition circuits ADC incorporate an inverter INV having a CMOS circuit and a feedback circuit NF connected thereto. The delay elements DL output one of the power supply voltages Vdd and Vss in correspondence with the input signal, where the voltage Vdd is larger than the voltage Vss. The addition circuits ADC output to the outputs of the delay elements DL a voltage that is approximately midway between the voltages Vss and Vdd. Therefore, when the voltage output by the delay element DL is larger than the midway voltage Vc, the midway voltage Vc is applied to this voltage, thus restraining the increase in the voltage. Alternatively, when the voltage output by the delay element DL is smaller than the midway voltage Vc, the midway voltage Vc is applied to this voltage, thus restraining the decrease in the voltage. In this way, the midway voltage Vc reduces the change in the voltage output by the delay element DL.

Figure 8:
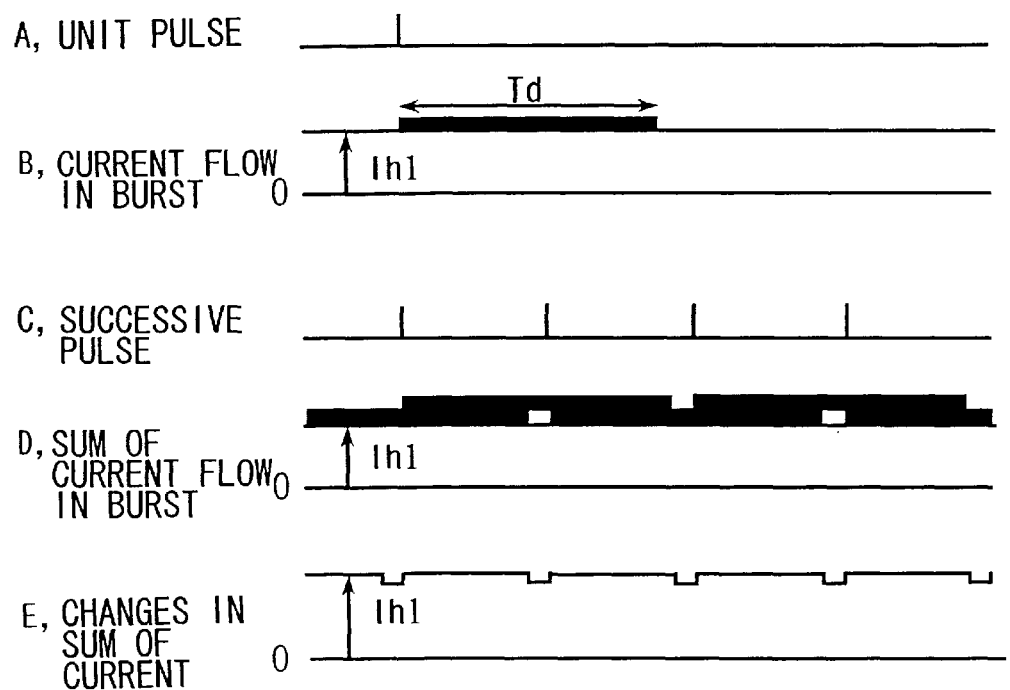
FIG. 8 shows the waves of the signals for the delay device D10 of FIG. 7.

FIG. 8 shows the waves of the current flowing in the delay device D10. Once a unit pulse signal is input to the delay device D10 as shown in FIG. 8(A), the current flows in a burst through the delay device D10 as shown in FIG. 8(B). Since the addition circuit ADC gives the delay element DL the midway voltage Vc, the pass-through current Ih1 flows from the voltage Vdd to the voltage Vss. The whole current is the sum of this pass-through current and the operation current that flows in the delay element DL by the input signal. Adding the midway voltage Vc to the voltage output by the delay element DL reduces the change in this voltage, the result being a reduction in the change in the current consumed for driving the signal in comparison with the related art. Even though successive pulses are input as shown in FIG. 8(C), the amplitude of the current consumed by each pulse is small as shown in FIG. 8(D). Therefore, the change in the current of the delay device D10 is smaller compared with the relate art, as shown in FIG. 8(E). Furthermore, the change in the voltage of the delay device D10 is small, thus increasing the accuracy of the delay time. An improvement in the accuracy of the delay time of the delay device D10 enhances the accuracy of the delay circuit 100, which in turn enhances the accuracy of the semiconductor testing device of FIG. 5. Further, the change in the power supply voltage is reduced, which decreases the electromagnetic wave noise radiating from the delay device D10.

Figure 9:
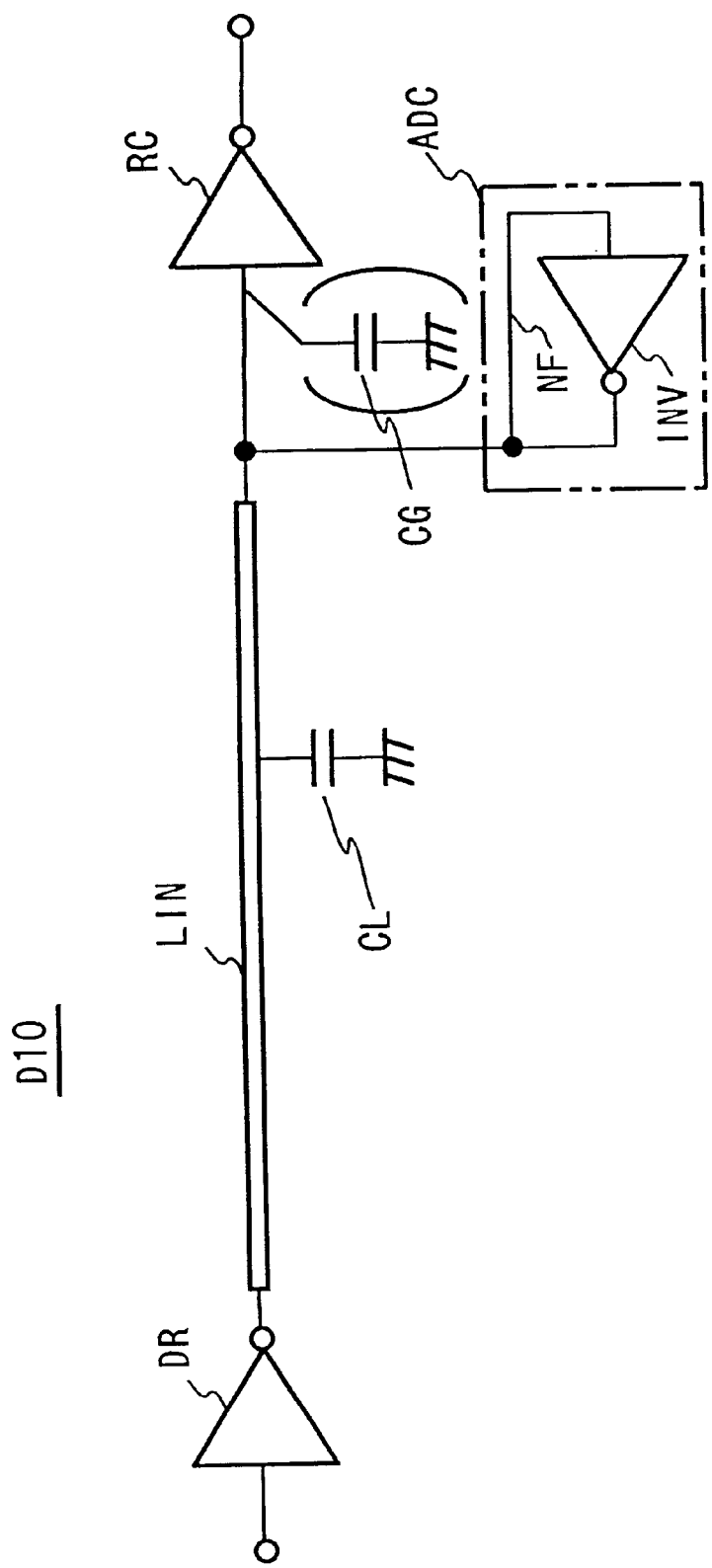
FIG. 9 shows an example of the delay device D10.

FIG. 9 shows an example of the delay device D10. The drive circuit DR and the receipt circuit RC corresponds to the delay element DL of FIG. 7. The signal line LIN is connected to the addition circuit ADC. The addition circuit ADC includes an inverter having a CMOS circuit, and a feedback circuit NF. For high speed signal transmission there might be an overshoot or an undershoot in the signal wave when the signal advancing along the signal line LIN is respectively reflected or absorbed by the receipt circuit RC. To reduce any overshoot or undershoot, the addition circuit ADC may be connected to the end of the signal line LIN.

Figure 10:
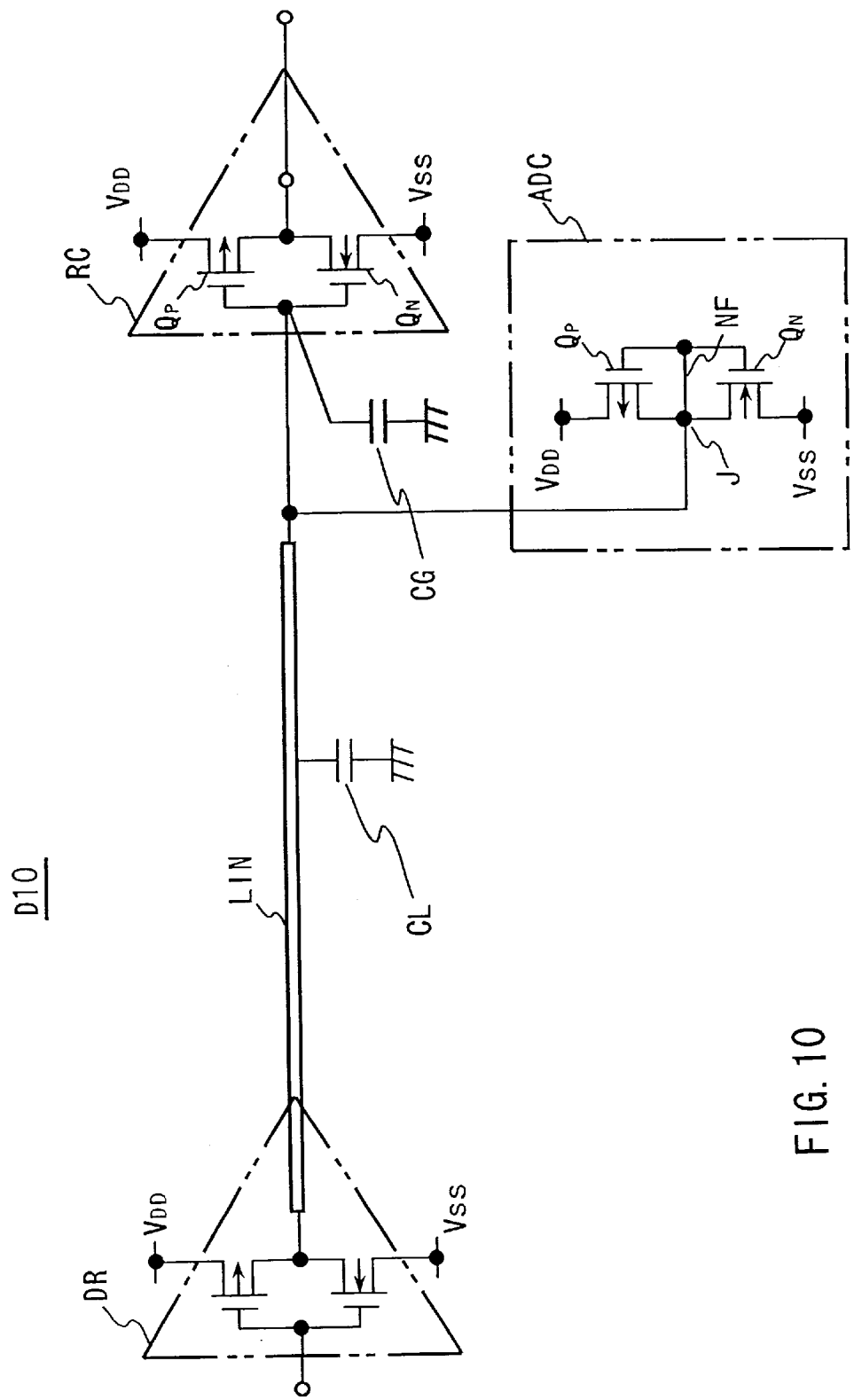
FIG. 10 shows an example of the delay device D10.

FIG. 10 shows an example of the structure of the delay device D10. Both the drive circuit DR and the receipt circuit RC employ an inverter INV provided with the CMOS circuit. The addition circuit ADC may also include an inverter INV having the CMOS circuit, and a feedback circuit NF. This addition circuit ADC stabilizes the voltage at the common junction J of the input and output terminals of the inverter INV, to set it at approximately midway between the voltages Vdd and Vss. The reason for this follows referring to FIG. 11.

Figure 11:
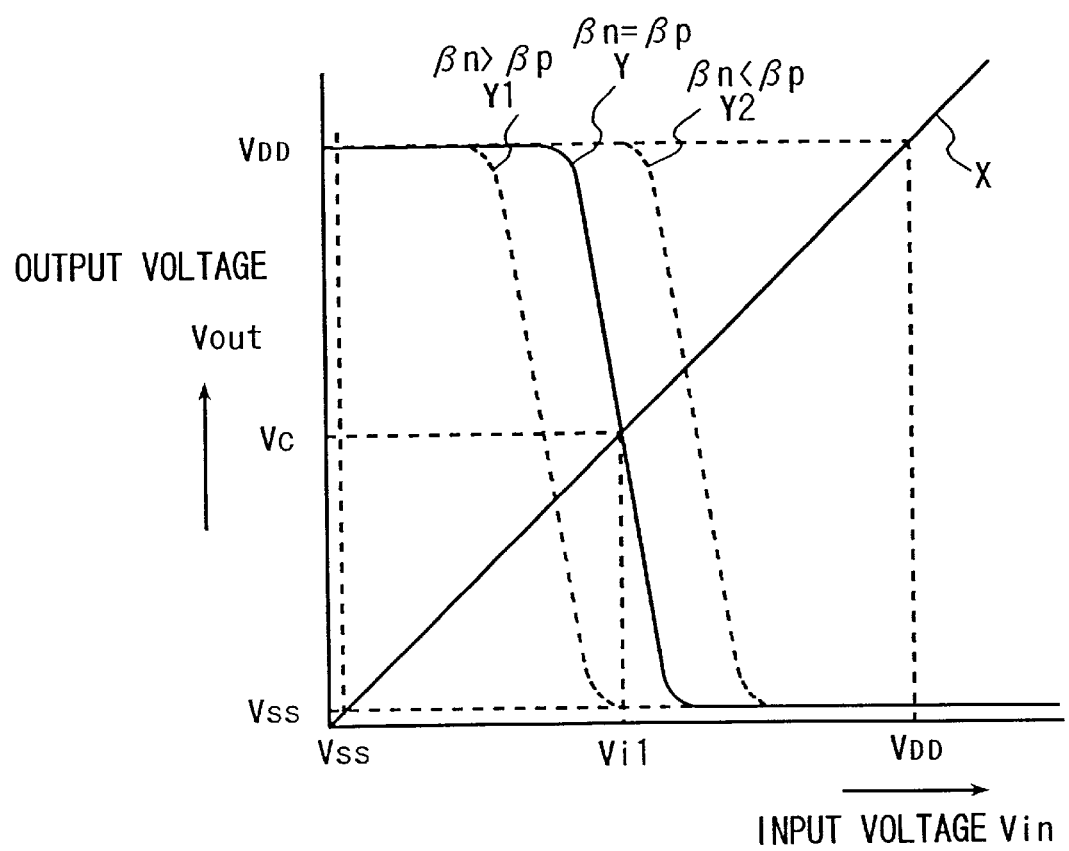
FIG. 11 shows the operation of the delay device D10.

FIG. 11 shows the direct transmission characteristic Y, that is, the relationship between the input voltage and the output voltage of the inverter INV. Since the inverter INV logically inverts, the characteristic falls around the logical threshold. Here, feedback is obtained by shorting the input and output terminals or connecting them using a resistor which equalizes the input voltage and the output voltage. Accordingly, drawing a straight line X with Vin=Vout overlapping with the curved line Y equalizes the output voltage at the intersection point of the straight line X and the curved line Y. The intersection point is the point where the output voltage inverts in the direct transmission characteristic, that is, a point which is equivalent to the logical threshold of the inverter INV. If the on-resistors of the P-type FET Qp and the N-type FET Qn are equivalent to each other, the intersection point is at the midway point between the voltage Vss and the voltage Vdd.

Here, the on-resistor is non-linear. It is more correctly expressed by saying the coefficient β is employed as an index indicating whether or not the drain current of the FET readily flows. The drain current coefficient β is a proportional constant defined by the size of the MOS FET and the aspect ratio thereof.

Assuming that the coefficients β of the N-type FET Qn and the P-type FET Qp are βn and βp, $$\beta n = (W/Leff)*(\in ox/Tox)*\mu n, \text{ eff}$$

$$\beta p = (W/Leff)*(\in ox/Tox)*\mu p, \text{ eff}$$

where βn denotes the drain current efficient of the N-type FET Qn; βp denotes the drain current efficient of the P-type FET Qp; W denotes the gate width, Leff denotes the effective gate length; Tox denotes the gate oxidation film thickness; ∈ox denotes the gate oxidation film dielectric constant; μn, eff denotes the effective mobility of the electron; and μp, eff denotes the effective mobility of the hole.

Using the coefficient, the drain current of the MOS FET is expressed as following.

$$\text{If } Vds \leq Vgs-Vt, Id=\beta\{(Vgs-Vt)Vds-(\tfrac{1}{2})(Vds^2)\}$$

$$\text{If } Vds > Vgs-Vt, Id=(\tfrac{1}{2})\beta(Vgs-Vt)^2$$

For silicon, the mobility of the hole is almost half of that of electrons; therefore, if the N-type FET Qn and the P-type FET Qp are shaped similar to each other on assumption that the thresholds are equivalent to each other, the current flowing in the N-type FET Qn will be double that of the current flowing in the P-type FET Qp. The on-resistor of the N-type FET Qn is half of that of the P-type FET Qp.

In general, the coefficients βn and βp are set to be the same, or the shapes (W, H) are set to be the same. Changing the beta ratio βR, that is, the ratio of the coefficients βn and βp, by ten times or one-tenth gives the curved line Y1 or Y2 in FIG. 11. Here, the curved line Y1 can be set with βn>βp (βR=10), and the curved line Y2 can be set with βn<βp (βR=0.1). In this case, setting the ratio βR of the inverter INV in the receipt circuit RC like that of the inverter in the addition circuit ADC allows the threshold voltage that the receipt circuit RC inverts to be similar to the midway voltage Vc. Accordingly, establishing the relationship between the inverter INV in the addition circuit ADC and the inverter INV in the receipt circuit RC as described above enables the receipt circuit RC to process the incoming signal based upon its threshold voltage.

Figure 12:
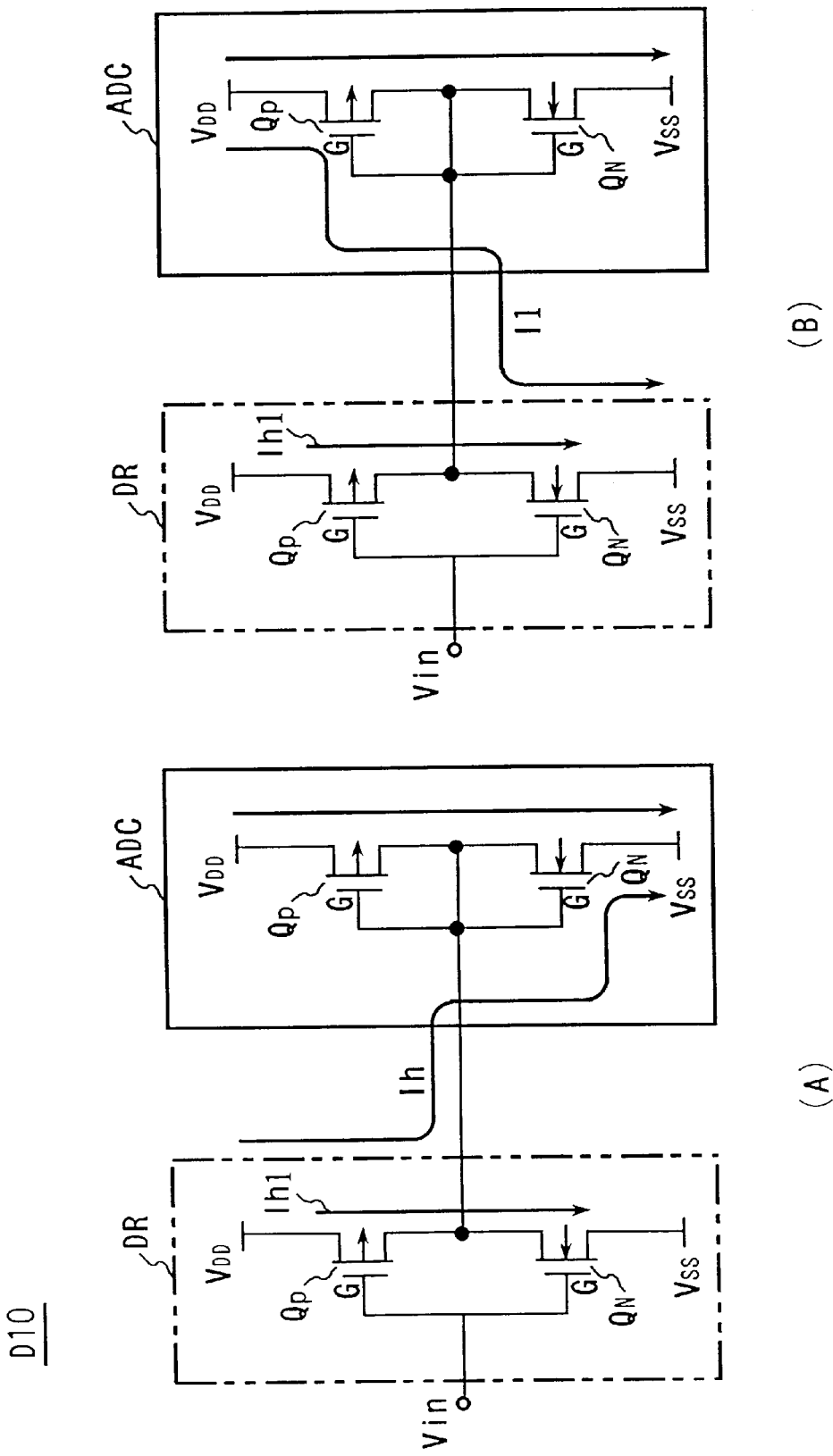
FIG. 12 shows the pass-through current Ih1, and the power supply current Ih and I1 flowing in the delay device D10.

FIG. 12 shows the current Ih or I1 flowing in the drive circuit DR and the addition circuit ADC in the delay device D10 of FIG. 10. It also shows the pass-through current Ih1 flowing in the drive circuit DR. FIG. 12(A) shows that the input voltage Vin of the drive circuit DR is below the midway voltage Vc. When the input voltage Vin of the drive circuit DR is smaller than the midway voltage Vc, the current Ih flows from the voltage Vdd of the drive circuit DR to the voltage Vss of the addition circuit ADC. Simultaneously, the pass-through current Ih1 flows from the voltage Vdd of the drive circuit DR to the voltage Vss. FIG. 12(B) shows that the input voltage Vin of the drive circuit DR is larger than the midway voltage Vc. When the input voltage Vin of the drive circuit DR is larger than the midway voltage Vc, the current I1 flows from the voltage Vdd of the addition circuit ADC to the voltage Vss of the drive circuit DR. Simultaneously, the pass-through current Ih1 flows from the voltage Vdd of the drive circuit DR to the voltage Vss.

Figure 13:
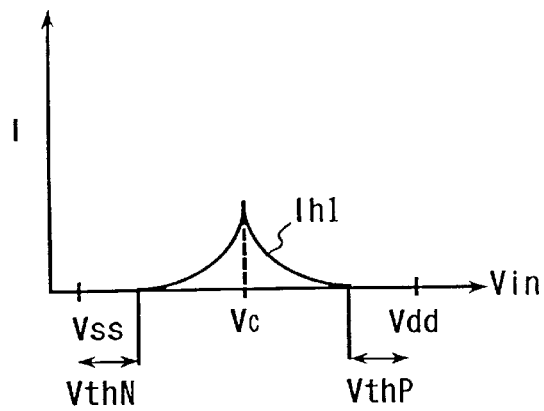
FIG. 13 shows the relationship among the input voltage Vin, an the power supply current Ih and I1.
Figure 13:
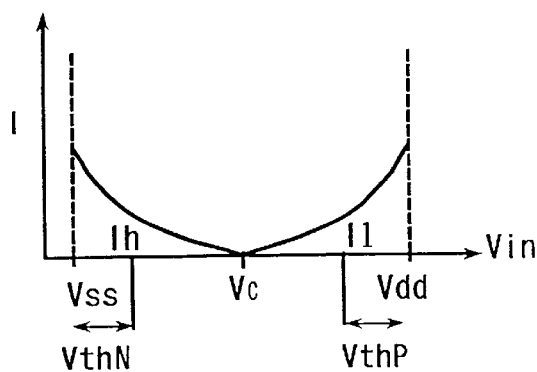
Figure 13:
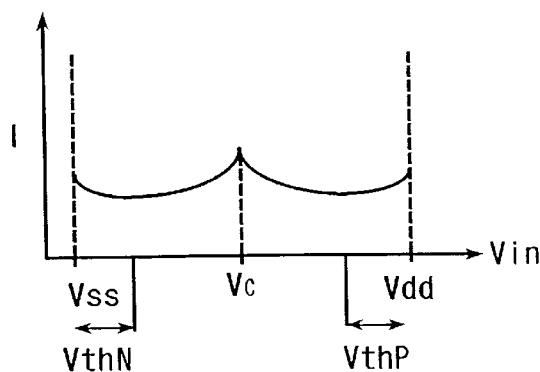

FIG. 13 shows the current Ih and the pass-through current Ih1 flowing in the delay device D10 of FIG. 12. FIG. 11(A) shows the relationship between the voltage Vin and the pass-through current Ih1 flowing from the voltage Vdd of the drive circuit DR to the voltage Vss. FIG. 13(B) shows the relationship between the input voltage Vin, the current Ih, and current I1. In FIG. 13(A), when the input voltage Vin is equivalent to the midway voltage Vc, because the midway voltage Vc is applied to the gates G of the two FET of the drive circuit DR, the pass-through current Ih1 becomes the maximum. Since the input voltage Vin and the midway voltage Vc are the same, no current flows between the drive circuit DR and the addition circuit ADC as shown in FIG. 13(B).

In FIG. 13(A), when the input voltage Vin is smaller than the midway voltage Vc, an inverse bias voltage is applied to the gate G of the N-type FET Qn of the drive circuit DR, and a forward bias voltage is applied to the gate G of the P-type FET Qp. The lower the input voltage Vin is compared with the midway voltage Vc, the higher the inverse bias voltage is, which in turn decreases the pass-through current Ih1. Similarly, the lower the input voltage Vin is compared with the midway voltage Vc, the higher the forward bias voltage is. The result is, the output voltage of the drive circuit DR becomes larger than the midway voltage Vc. Accordingly, the current Ih flowing from the voltage of the drive circuit DR to the voltage Vss of the addition circuit ADC becomes larger.

It follows that as shown in FIG. 13(A), when the input voltage Vin is higher than the midway voltage Vc, an inverse bias voltage is applied to the gate G of the P-type FET Qp, and a forward bias voltage is applied to the gate G of the N-type FET Qn. The higher the input voltage Vin is compared with the midway voltage Vc, the higher the inverse bias voltage, which in turn reduces the pass-through current Ih1. The higher the input voltage Vin is compared with the midway voltage Vc, the higher the forward bias voltage is. The result is, the current Ih flowing from the voltage Vdd of the addition circuit ADC to the voltage Vss of the drive circuit DR becomes larger.

FIG. 13(C) shows the relationship among the input voltage Vin, the pass-through current Ih1, and current Ih or I1. The sum of the pass-through current Ih1 and the current Ih, and the sum of the pass-through current Ih and current I1 are almost constant for the input voltage Vin. Hence, the change in the current is reduced by outputting the midway voltage Vc from the addition circuit ADC to the output of the drive circuit DR.

Figure 14:
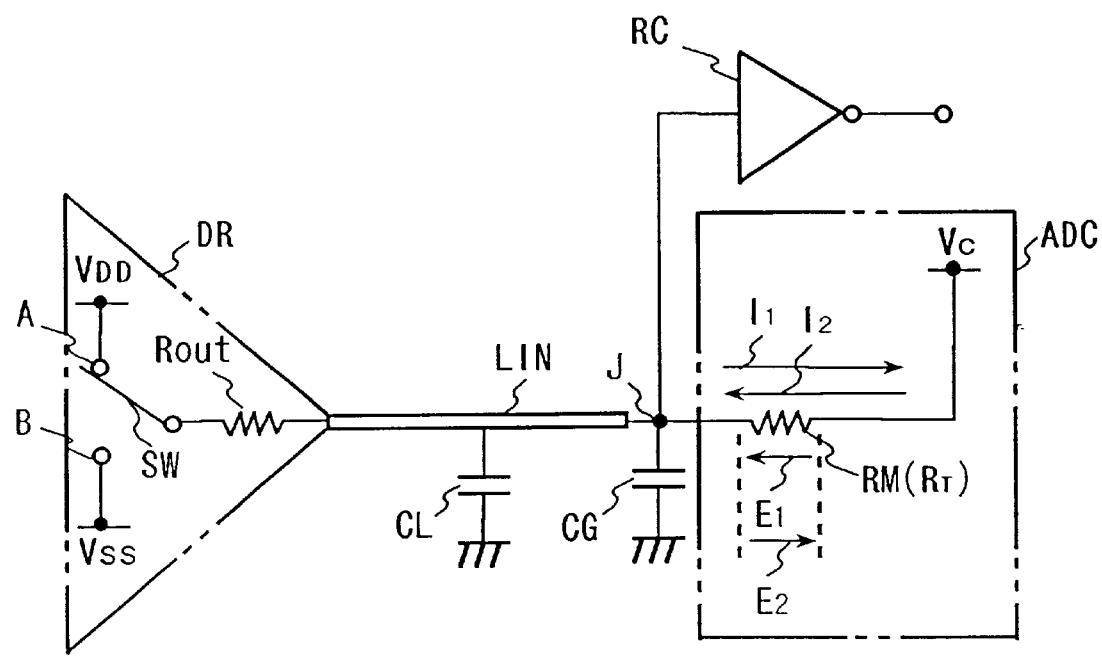
FIG. 14 shows an equivalent circuit of the delay device D10.

FIG. 14 shows an equivalent circuit of the delay device D10 of FIG. 10. The drive circuit DR is equivalently represented using the switch SW. Here, Rout represents the output impedance of the drive circuit DR. In FIG. 14, the direct resistance of the signal line LIN is neglected. RM denotes the equivalent resistor equal to the output impedance of the addition circuit ADC. That is, the addition circuit ADC is represented as a circuit where a resistor is connected to the midway voltage Vc via the equivalent resistor RM. In the drive circuit DR, the switch SW connects to the contact point A and the voltage Vdd is applied to the signal line LIN via the output impedance Rout. At this time, the current I1 flows into the impedance Rt, and a voltage larger than the midway voltage Vc arises at the common intersection point J. Expressing this voltage as Vc+E1, the voltage E1 is represented as (Vdd−Vc) Rt/(Rt+Rout).

Alternatively, the switch SW connects to the contact point B and the voltage Vss is applied to the signal line LIN. Following this, the current I2 flows into the impedance Rt, and a voltage smaller than the midway voltage Vc arises at the common intersection point J. Expressing this voltage as Vc+E2, the voltage E2 is expressed as (Vss−Vc) Rt/(Rt+Rout).

Figure 15:
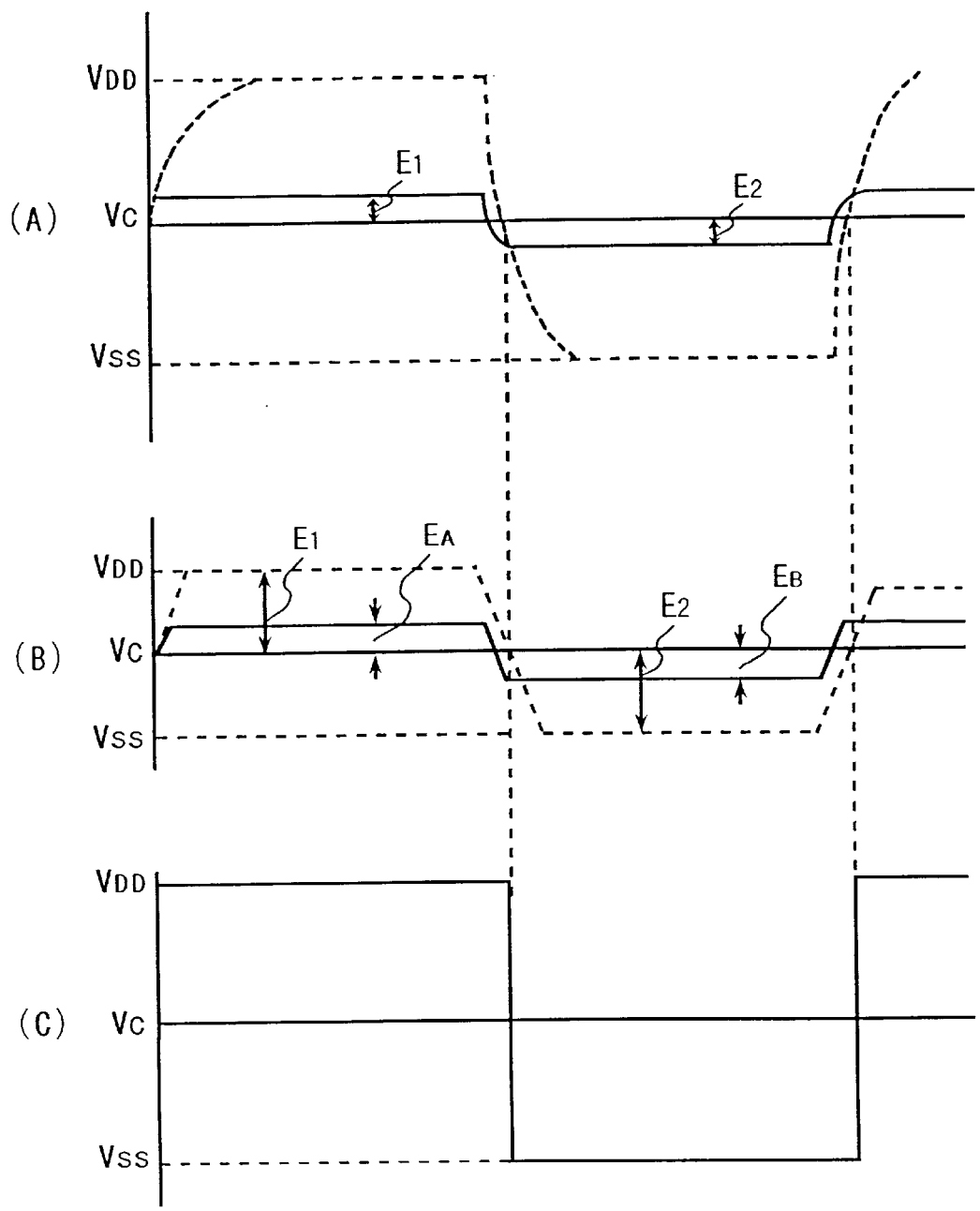
FIG. 15 shows the outputs of the addition circuit ADC and the receipt circuit RC.

FIG. 15 shows the outputs of the addition circuit ADC and the receipt circuit RC. The resistor Rt of the equivalent resist circuit RM is small, where Rt<<Rout. Accordingly, the voltages E1 and E2 arising at the common intersection point J are narrow as shown in FIG. 15(A). In addition, since the receipt circuit RC works by regarding the midway voltage Vc as the threshold of the inverse function, the receipt circuit RC securely inverts at the voltages Ea and Eb laid within the voltage E1 and E2. Accordingly, the receipt circuit RC inverts the voltage once at the common intersection point J where it crosses the midway voltage Vc. Even though the sum of the wiring capacitance CL and the input capacitance CG is large, and the change in the voltage of the signal line LIN is delayed, the output of the receipt circuit RC can be transmitted with few distortion as shown in FIG. 15(C).

The voltage E1 and E2 are the functions of the resistors Rt and Rout as explained above. The smaller the resistor Rt is, the smaller the voltage E1 and E2 are. However, the resistor Rt is required to be defined within the signal sensitivity of the receipt circuit RC because the receipt circuit RC has the threshold voltage. It is assumed that the maximum input voltage VthL allows the receipt circuit RC to output a stable Low signal or High signal when a Low signal is input, and the minimum input voltage VthH allows the receipt circuit RC to output a stable High signal or Low signal when a High signal is input.

The input voltage VthL may be defined as the voltage level when the output of the receipt circuit RC starts to substantially change when the input signal is gradually increased from Low. The input voltage VthH may be defined as the voltage level when the output of the receipt circuit RC starts to substantially change when the input signal is gradually decreased from High. For example, when the input voltage VthH is Vc+(Vdd−Vc)*0.2 and the input voltage VthL is Vc+(Vss−Vc)*0.2, the ratio of the resistors Rt and Rout is preferably equal to or larger than ¼ according to the expression of the voltage E1 and E2. More preferably, the value that the resistor Rt is divided by the resistor Rout is laid between ½ and ¼.

Here, the midway voltage Vc denotes not only the center voltage between the voltage Vdd and the voltage Vss. As described and referring to FIG. 11, the midway voltage Vc denotes an arbitrary voltage between the voltage Vdd and the voltage Vss in correspondence with the ratio, and is not limited to the center voltage.

Figure 16:
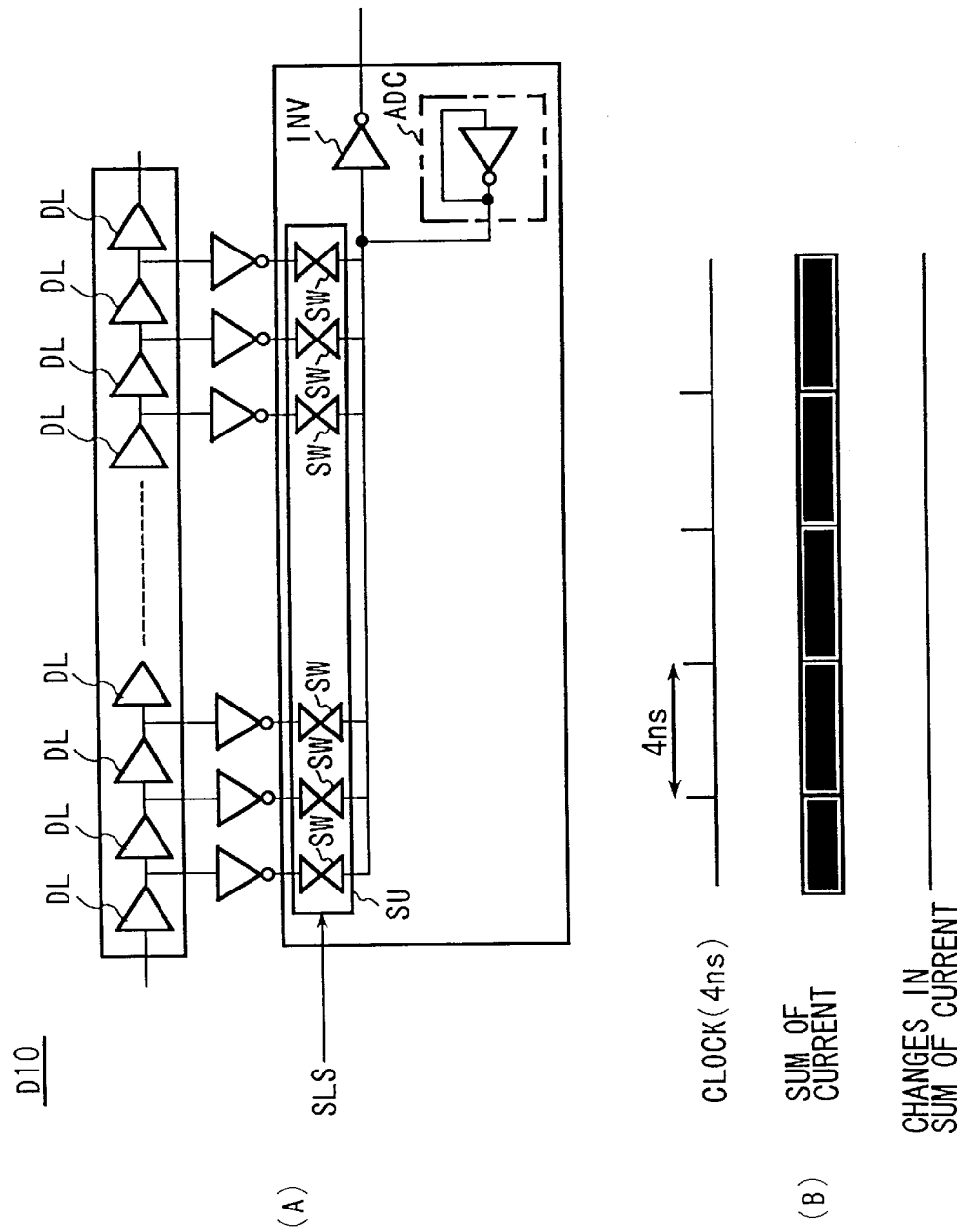
FIG. 16 shows another delay device D10.
Figure 17:
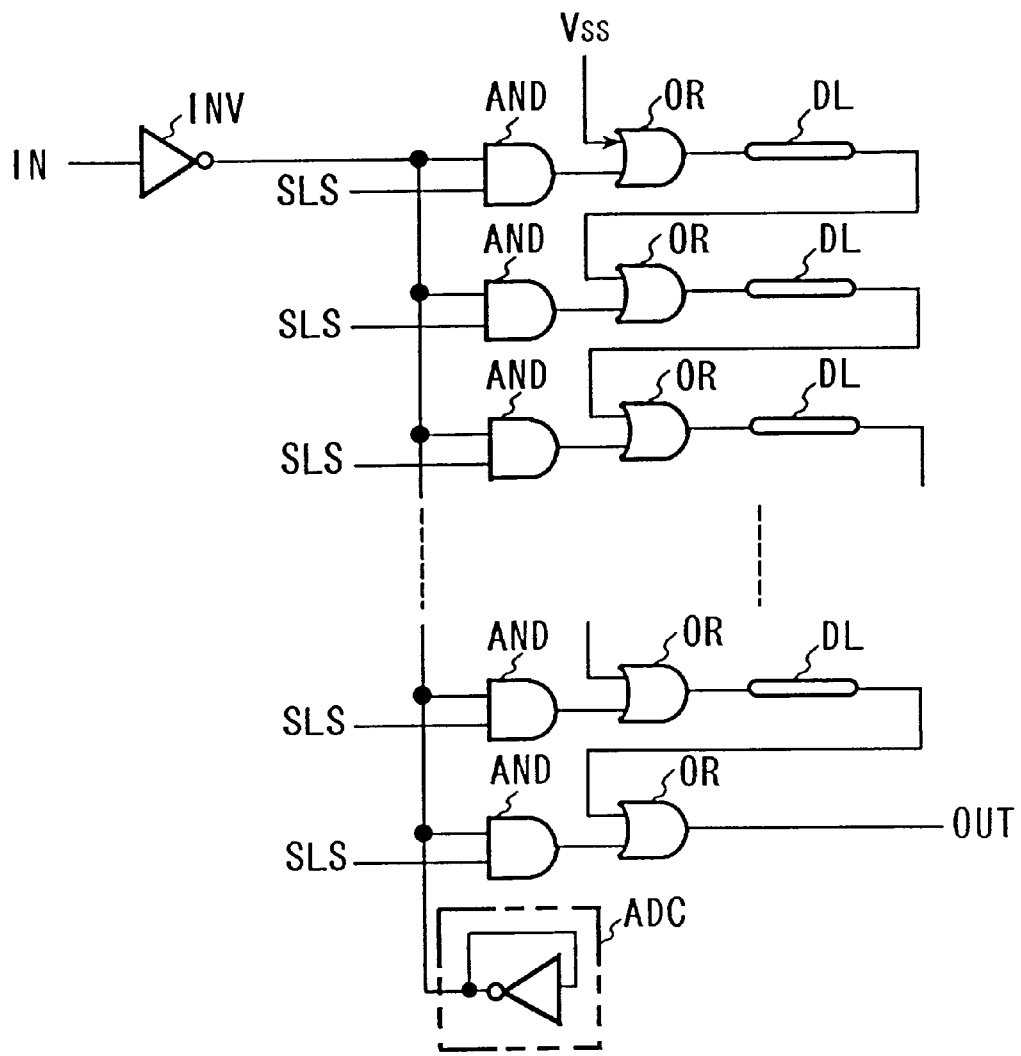
FIG. 17 shows other delay device D10.

FIG. 16 shows another delay device D10, and FIG. 17 shows the delay device D10 including the circuit that controls the delay time based upon the timing set signal. FIG. 16(A) shows the structure of the delay device D10 while FIG. 16(B) shows the waves in the delay device D10. In FIG. 16(A), the delay device D10 incorporates a plurality of delay elements in series with each other; a switching unit SU that selectively outputs one of the outputs of the delay circuits DL according to the selection signal SLS; an addition circuit ADC that outputs the midway voltage Vc to the output of the switching unit SU; and an inverter INV that feeds the output of the switching unit SU outward.

Here, the selection signal SLS is an example of the timing set signal shown in FIGS. 5 and 6. The switching unit SU includes a plurality of switches SW switching the outputs of the delay, elements DL to the inverter INV. Each delay element DL delays the input transmission signal in order to give the input transmission signal to the following delay element. Providing the switching unit SU with the selection signal SLS and selecting one among the outputs of the delay elements DL delays the transmission signal by a desired delay time. Outputting the midway voltage Vc to the output of the switching unit SU reduces the change in the power supply voltage thereby enhancing the accuracy of the delay time. Upon being selected by the switching unit SU, the transmission signal is fed outward via the inverter INV.

FIG. 16(B) shows the current wave when successive pulse signals are input to the delay device D10 at an interval of four (4) nanoseconds, where each pulse allows a current to flow in the delay device D10 during the four (4) nanoseconds. Since the interval at which the pulse signal is fed is equivalent to the time period during which the current is permitted to flow in the delay device D10, the current flows are not overlapping with each other. Accordingly, the waveform remains constant. Selecting a desired switch SW enables the delay device D10 to change the delay time, thus creating a desired clock signal. Since a large number of switches SW are commonly connected to the output terminals of the switching unit SU, the load capacitance is large.

Accordingly, the operation of the switch SW and the inverter INV changes the voltage of the delay device D10. The addition circuit ADC outputs the midway voltage, where the voltage output by the switching unit SU is reduced. The result is, any change in the current that flows in the delay device D10 when the signal changes is reduced, and further any change in the voltage is also reduced. In the example, the addition circuit ADC is connected only to the output of switching unit SU; however, if the addition circuit ADC was connected to the outputs of the delay elements DL and the inputs of the switches SW, any change in the current would be further reduced.

FIG. 17 shows another delay device D10. In this figure, the delay device D10 includes a circuit that controls the delay time based upon the timing set signal. The delay device D10 incorporates a plurality of delay elements DL that delay the transmission signal IN; a plurality of or-gate OR that each give the transmission signal to the following delay element DL; a plurality of and-gate AND that each give the transmission signal to the following or-gate OR upon being fed with the selection signal SLS; an inverter INV that gives the transmission signal to the and-gate AND; and an addition circuit ADC that outputs the midway voltage Vc to the transmission signal output by the inverter INV. The selection signal SLS is an example of the timing set signal shown in FIGS. 5 and 6.

The delay elements DL are connected in series via the or-gate OR, to delay the incoming transmission signal by a given time. The whole delay time of the delay device D10 is defined by the number of delay elements DL through which the transmission signal passes. Accordingly, allotting the selection signal SLS to the delay elements DL enables adjustment of the delay time. For example, the selection signal SLS is applied to the highest and-gate AND. This and-gate AND give the transmission signal to the next highest or-gate OR. Next, the or-gate OR gives the transmission signal to the following highest delay element DL. The transmission signal passes through all the delay elements DL to be fed outward. Therefore, the delay time of the delay device D10 becomes the maximum delay possible.

The selection signal SLS is applied to the lowest and-gate AND. This and-gate AND gives the transmission signal to the next lowest or-gate OR. Since no delay element DL follows the lowest or-gate OR, the transmission signal does not pass through any delay element DL to be fed outward. Applying the selection signal SLS to the delay element DL in this way allows the transmission signal to be output without any delay. Selecting the delay element DL to which the selection signal SLS is applied can adjust the delay time. Since a large number of and-gate AND are connected to the output terminals of the inverter INV, the load capacitance when the inverter operates is large. Accordingly, when the inverter INV and the and-gate AND work in response to the transmission signal, the voltage of the delay device D10 is altered.

Outputting the midway voltage Vc reduces the voltage of the signal output from the inverter INV. Therefore, any change in the current that flows in the delay device D10 when the signal is changed is reduced which serves to decrease any change in the voltage. This therefore improves the accuracy of the delay time. In the example, the addition circuit ADC is connected only to the output of the inverter INV however, connecting the addition circuit ADC to the output of the and-gate AND and the output of the or-gate OR can further reduce any changes in the current.

Figure 18:
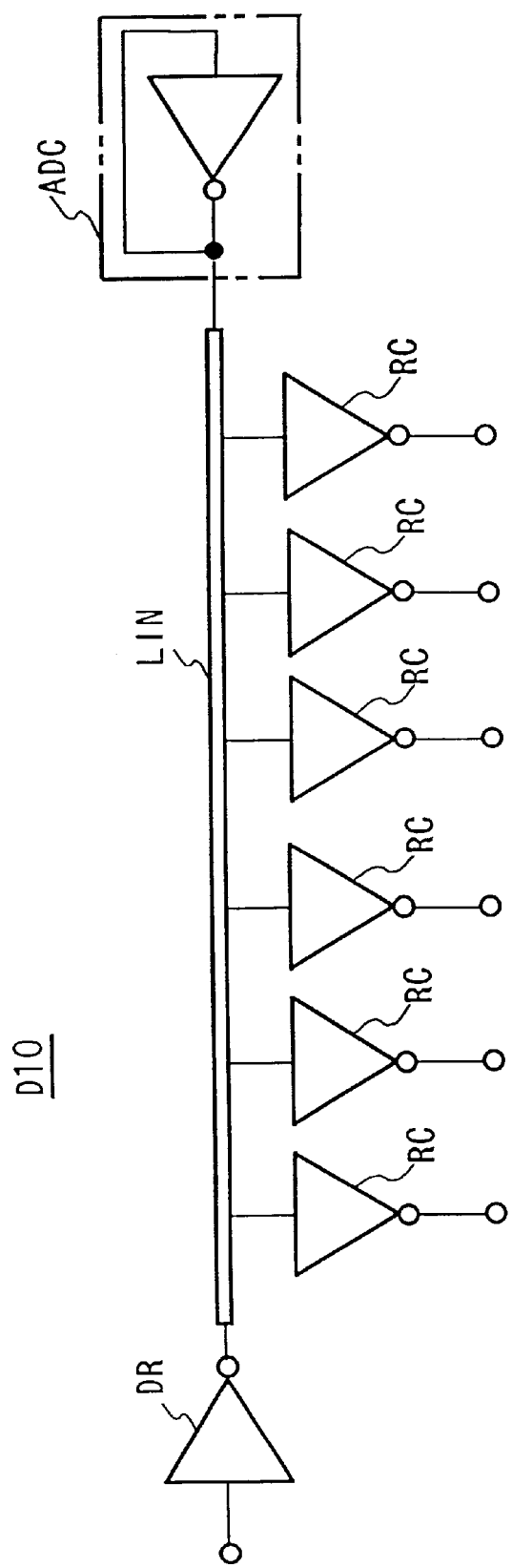
FIG. 18 shows still other delay device D10.

FIG. 18 shows still another delay device D10. In this figure, the delay device D10 is shown without the circuit that controls the delay time based upon the timing set signal. A large number of receipt circuits RC are connected to the signal line LIN, creating a large wiring capacitance CL and input capacitance CG in the signal line LIN. Accordingly, a change in the signal causes a large current to flow which changes the voltage. This leads to a large change in the delay time. The addition circuit ADC is connected to the signal line LIN to which the receipt circuits RC that are apt to change the voltage are connected. This reduces the change in the voltage of the delay device D10, thus decreasing the change in the delay time.

Figure 19:
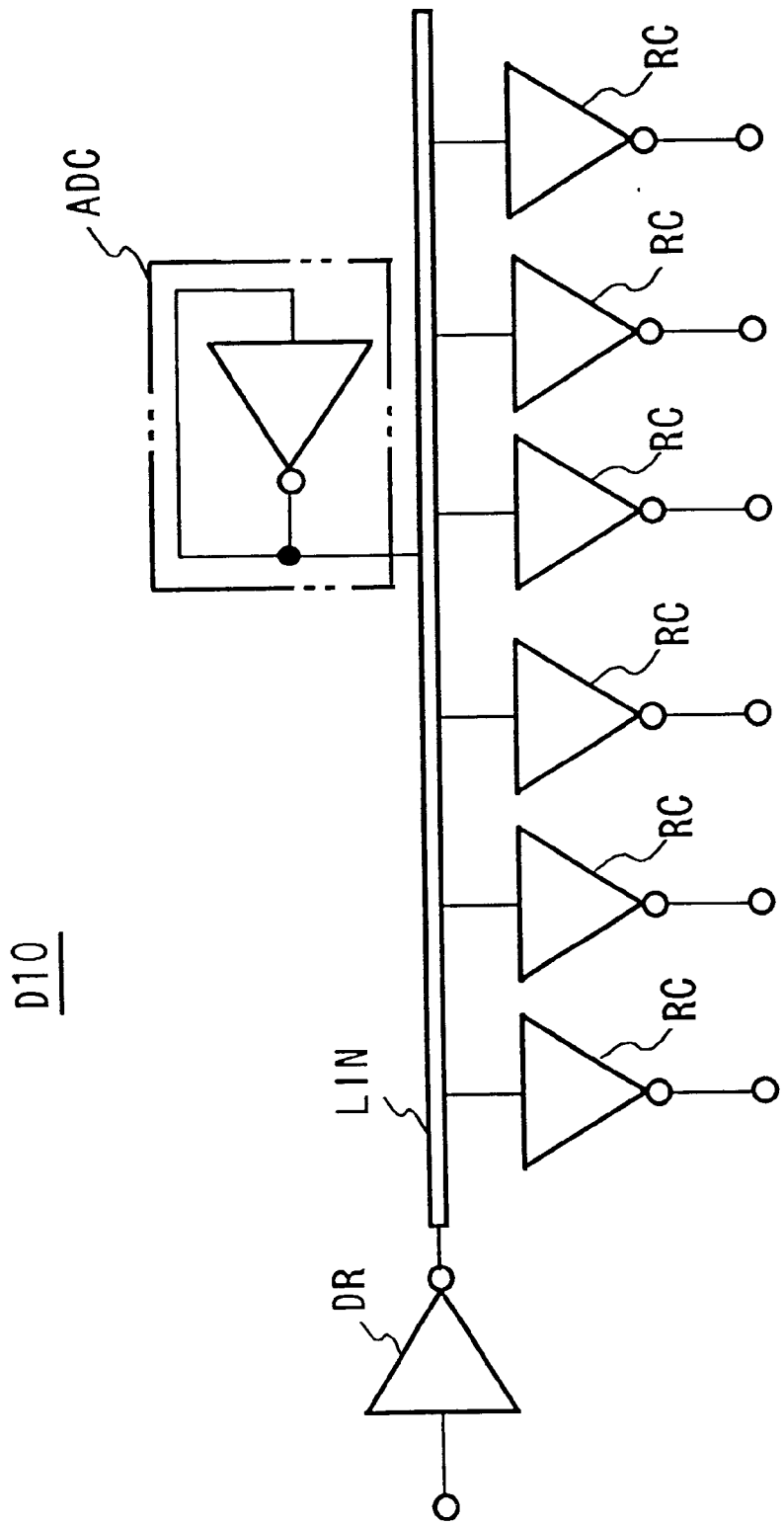
FIG. 19 shows the improvement of the delay device D10 of FIG. 18

FIG. 19 shows an improvement of the delay device D10 of FIG. 18. The addition circuit ADC may be connected to any position of the signal line LIN.

Figure 20:
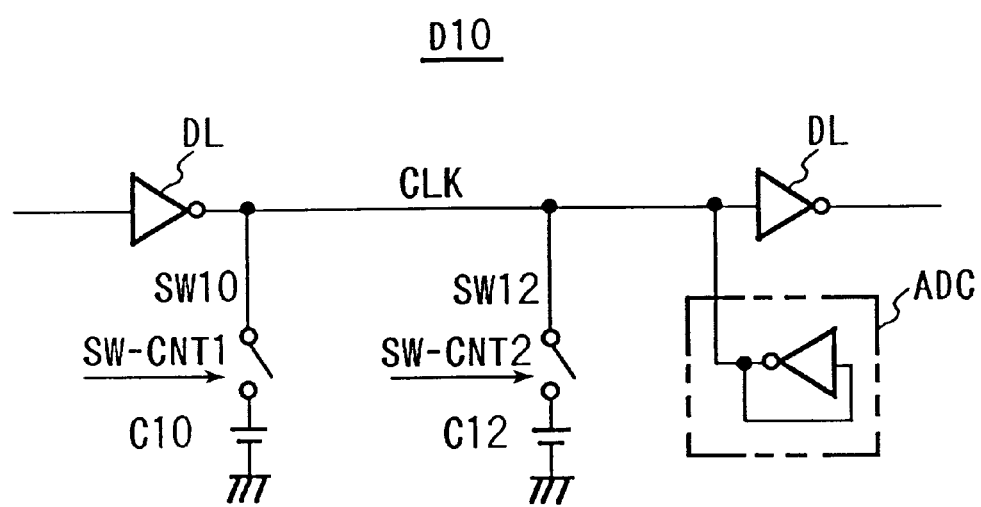
FIG. 20 shows still other delay device D10.

FIG. 20 shows further another delay device D10. In this figure, the delay device D10 is shown including a circuit that controls the delay time based upon the timing set signal. The delay device D10 comprises a plurality of delay elements DL in series with each other; a plurality of capacitors C10 and C12 that store the electric charge of the transmission signal output from the delay elements DL; switches SW10 and SW12 that switch the capacitors C10 and C12 to the delay elements DL; and an addition circuit ADC that outputs the midway voltage Vc to the outputs of the delay element DL. In FIG. 20, the capacitors C10 and C12 are connected to the voltage Vss, however, it may also be connected to the voltage Vdd.

For example, the switching signal SW-CNT1 is provided to the switch SW10 in such a fashion that the switch SW10 connects the outputs of the delay elements DL and the capacitor C10. Further, the switching signal SW-CNT2 is provided to the switch SW12 in such a fashion that the switch SW12 connects the outputs of the delay elements DL and the capacitors C12. The incoming transmission signal is delayed by the delay element DL to be fed into the following delay element DL. The capacitors C10 and C12 store the electric charge of the transmission signal, thus delaying the transmission signal. Selection among the switches SW10 and SW12 can adjust the delay time. For example, if the capacitor C10 is selected but the capacitor C12 not selected, since the electric charge of the transmission signal is stored only in the capacitor C10, the delay time becomes shorter than the delay time when both the capacitors C10 and C12 are selected. Here, the switching signals SW-CNT1 and SW-CNT2 are examples of the timing set signals of FIGS. 5 and 6.

The operation of the delay elements DL changes the voltage of the delay device D10. Storing the electric charge of the output of the delay elements D1 in the capacitors C10 and C12 increases changes to the voltage of the delay device D10. However, the outputting of the midway voltage Vc decreases the changes in the voltage of the delay device D10, thus enhancing the accuracy of the delay time.

Figure 21:
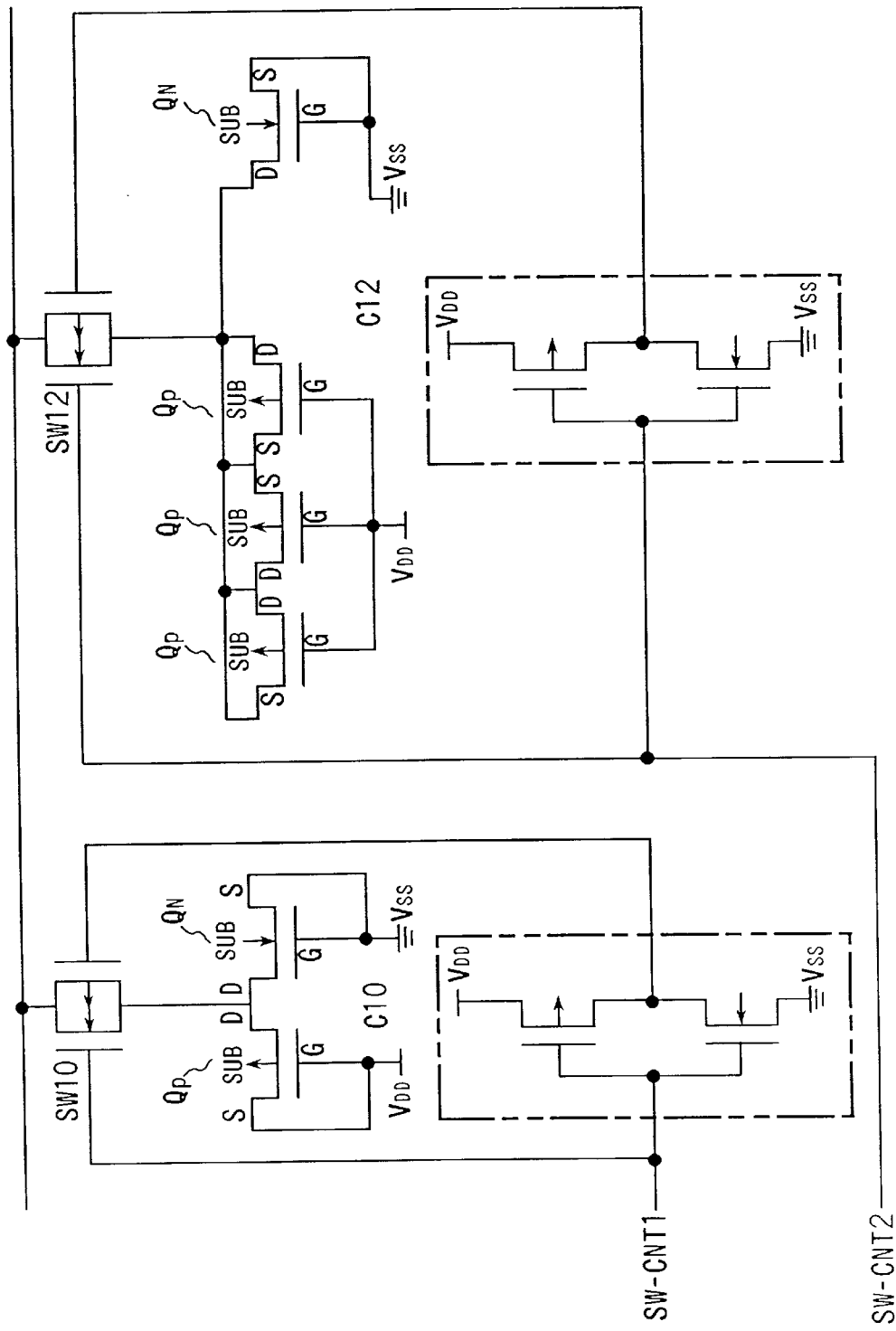
FIG. 21 shows an example of the switches SW10 and SW12.

FIG. 21 shows an example of the switches SW10 and SW12, and the capacitors C10 and C12 of FIG. 20. The capacitor C10 incorporates a P-type FET Qp that connects the switch SW10 and the voltage Vdd, and an N-type FET Qn that connects the switch SW10 and the voltage Vss. In the P-type FET Qp, the voltage Vdd is applied to the gate G, the source S is connected to the gate G, and the drain D is connected to the switch SW10. In the N-type FET Qn, the voltage Vss is applied to the gate G, the source S is connected to the gate G, and the drain D is connected to the switch SW10.

The capacitor C12 includes three P-type FET Qp and one N-type FET Qn. In each P-type FET Qp, the voltage Vdd is applied to the gate G, and the switch SW12 switches the drains D and the sources S to the outputs of the delay element DL. That is, the switch SW 12 connects the drains D and sources S to the output of the delay element DL or cuts off the connection. In the N-type FET Qn, the voltage Vss is applied to the gate G, the source S is connected to the gate G, and the drain D is connected to the switch SW12. In the P-type FET Qp and the N-type FET Qn of the capacitors C10 and C12, the gate G is insulated from the channel by the gate oxidation film. The drain D and the source S are insulated from the substrate SUB because of the fact that they are inversely biased with respect to the substrate SUB. Accordingly, the capacitors can be provided using FET circuits. In addition, changing the number and the position of the capacitors C10 and C12 can change the capacitance for storing the electric charge.

Figure 22:
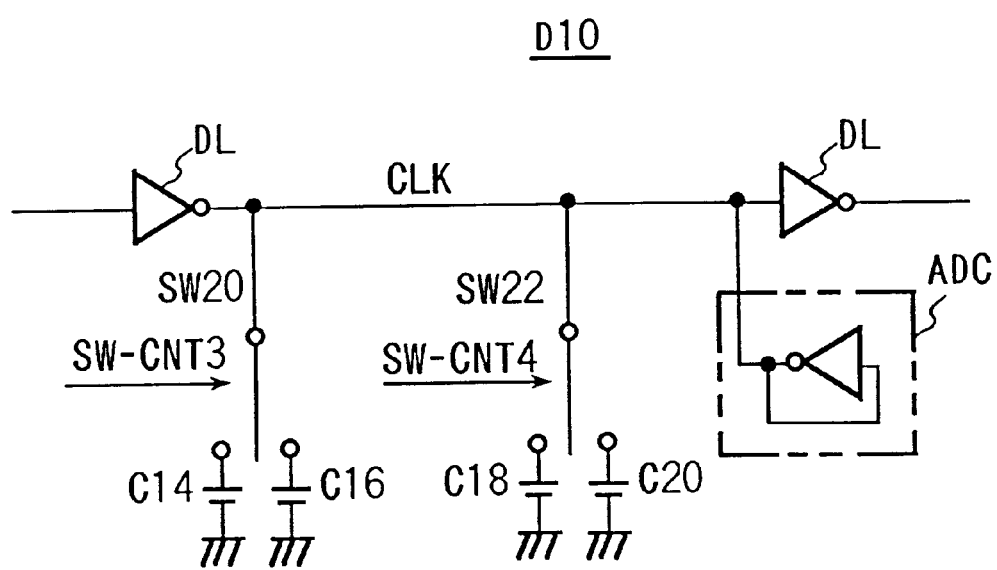
FIG. 22 shows still another delay device D10.

FIG. 22 shows still another delay device D10. In this figure, the delay device D10 is shown including a circuit that controls the delay time on the basis of the timing set signal. The delay device D10 includes a plurality of delay elements DL; a plurality of capacitors C14, C16, C18, and C20 that store the electric charge of the transmission signal; a switch SW20 that switches one of the capacitors C14 and C16 to the output of the delay element DL; a switch SW22 that switches one of the capacitors C18 and C20 to the output of the delay element DL; and an addition circuit ADC that outputs the midway voltage Vc to the output of the delay element DL. In FIG. 22, the capacitors C14, C16, C18, and C20 are connected to the voltage Vss. However, they may also be connected to the voltage Vdd.

For example, the switching signal SW-CNT3 is applied to the switch SW20 in such a way that the switch SW20 connects the output of the delay element DL and the capacitor C14. Further, the switching signal SW-CNT4 is applied to the switch SW 22 in such a way that the switch SW22 connects the output of the delay element DL and the capacitor C18. The incoming transmission signal undergoes a delay in the delay element DL and is fed into the following delay element DL. The capacitors C14 and C18 delay the transmission signal by storing the electric charge within. Accordingly, the switches SW20 and SW22 connect one of the capacitors C14 and C16 in parallel with each other and one of the capacitors C18 and C20 to the outputs of the delay elements DL, thus adjusting the delay time of the transmission signal. Further, the switch SW20 can select neither the capacitor C14 nor the capacitor C16, and the switch SW22 can select neither the capacitor C18 nor the capacitor C20. Here, the switching signals SW-CNT3 and SW-CNT4 are examples of the timing set signals of FIGS. 5 and 6.

The operation of the delay elements DL changes the voltage of the delay device D10. The capacitors C14, C16, C18, and C20 store the electric charge of the outputs of the delay elements DL, thus increasing the change in the voltage of the delay device D10. However, outputting the midway voltage Vc reduces the change in the voltage of the delay device D10, thus enhancing the accuracy of the delay time.

Figure 23:
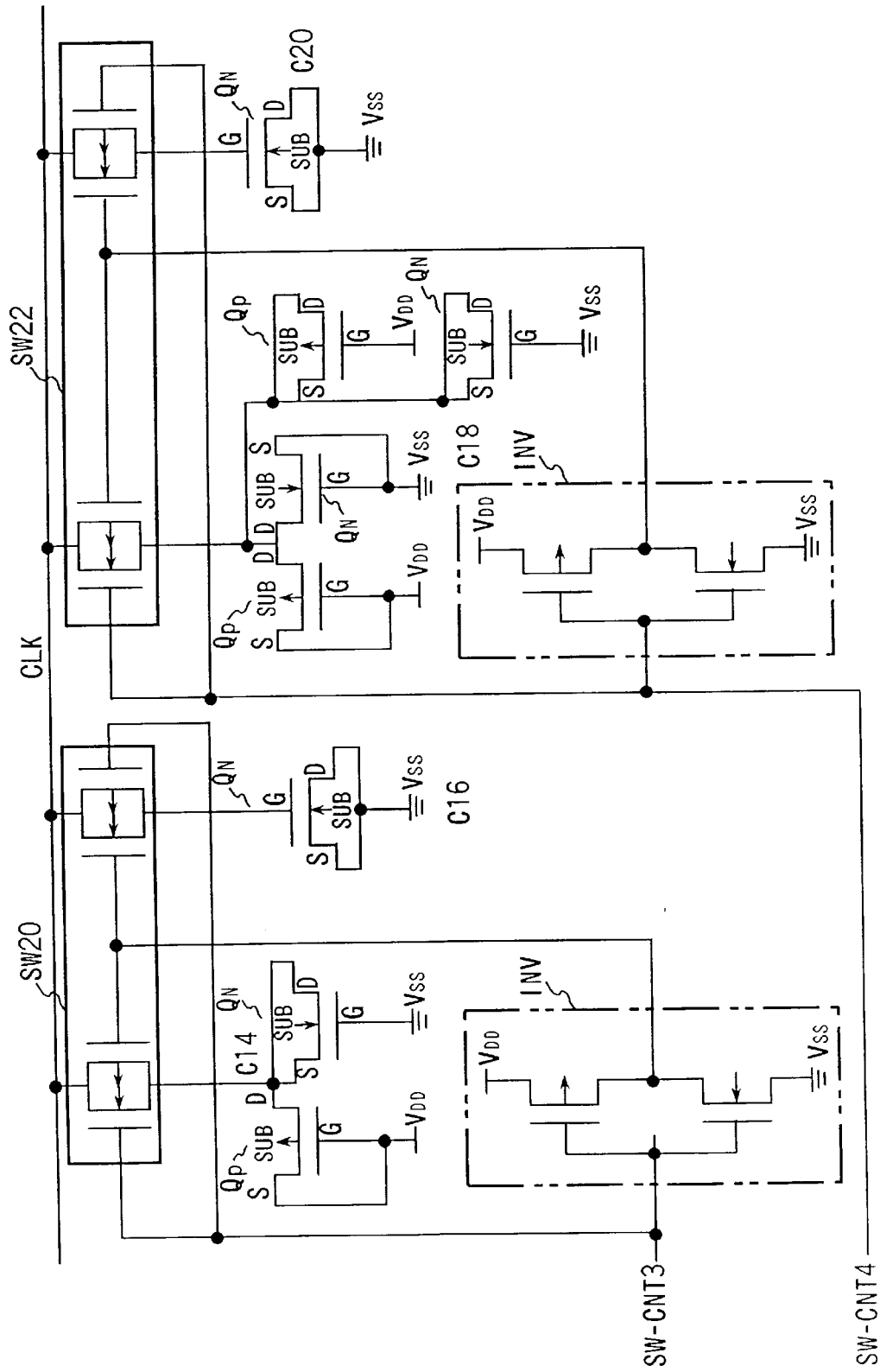
FIG. 23 shows an example of the switches SW20 and SW22.

FIG. 23 shows an example of the circuits of the switches SW20 and SW22, and the capacitors C14, C16, C18, and C20. The capacitor C14 includes a P-type FET Qp that connects the switch SW20 and the voltage Vdd, and an N-type FET Qn that connects the switch SW20 and the voltage Vss. In the P-type FET Qp, the voltage Vdd is applied to the gate G, the source S is connected to the gate G, and the drain D is connected to the switch SW20. In the N-type FET Qn, the voltage Vss is applied to the gate G, and the switch SW20 switches the drain D and the source S to the output of the delay element DL. The capacitor C16 includes an N-type FET Qn. In the N-type FET Qn, the voltage Vss is applied to the drain D and the source S, and the gate G is connected to the switch SW20.

The capacitor C18 includes two P-type FET Qp that connect the switch SW 22 and the voltage Vdd, and two N-type FET Qn that connect the switch SW22 and the voltage Vss. In one of the P-type FET Qp, the voltage Vdd is applied to the gate G, the source S is connected to the gate G, and the drain D is connected to the switch SW22. In the other P-type FET Qp, the voltage Vdd is applied to the gate G, and the switch SW22 switches the drain D and the source S to the output of the delay element DL. In one of the N-type FET Qn, the voltage Vss is applied to the gate G, the source S is connected to the gate G, and the drain D is connected to the switch SW22. In the other N-type FET Qn, the voltage Vss is applied to the gate G, and the switch SW22 switches the drain D and the source S to the output of the delay element DL. The capacitor C20 has an N-type FET Qn. In this N-type FET Qn, the voltage Vss is applied to the drain D and the source S, and the gate G is connected to the switch SW22.

The gate G of each of the P-type FET Qp and the N-type FET Qn in the capacitors C14 and C18 are insulated from the channel by the gate oxidation film. The drain D and the source S are insulated from the substrate SUB because of the fact that they are inversely biased with respect to the substrate SUB. Accordingly, the capacitors are constructed using FET circuits. For the capacitors C16 and C20, since the gate G is connected to the switches SW20 and SW22, the electric charge is stored when a transmission signal is input that inversely biases the gate G of the capacitors C16 and C20. Moreover, changing the number and the position of the P-type FET QP and the N-type FET Qn of the capacitors C14, C16, C18, and C20 changes the capacitance for storing the electric charge.

Figure 24:
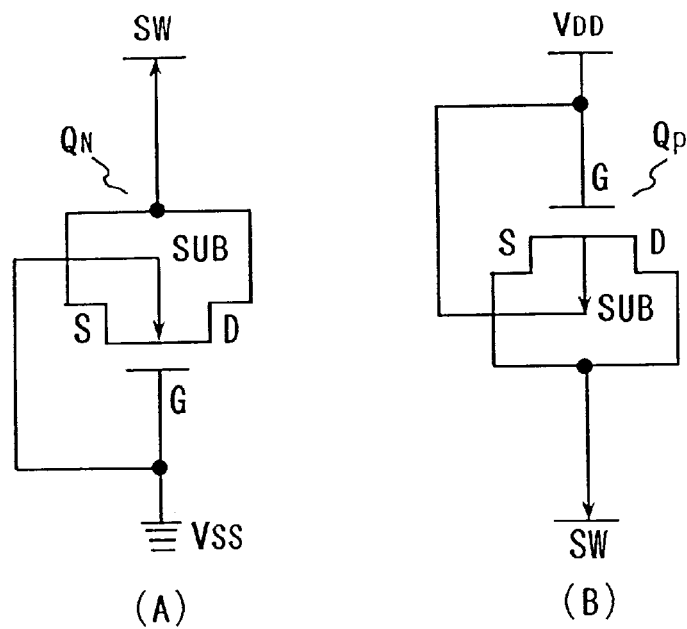
FIG. 24 shows an example of the capacitors C10, C12, C14, C16, C18, and C20.
Figure 24:
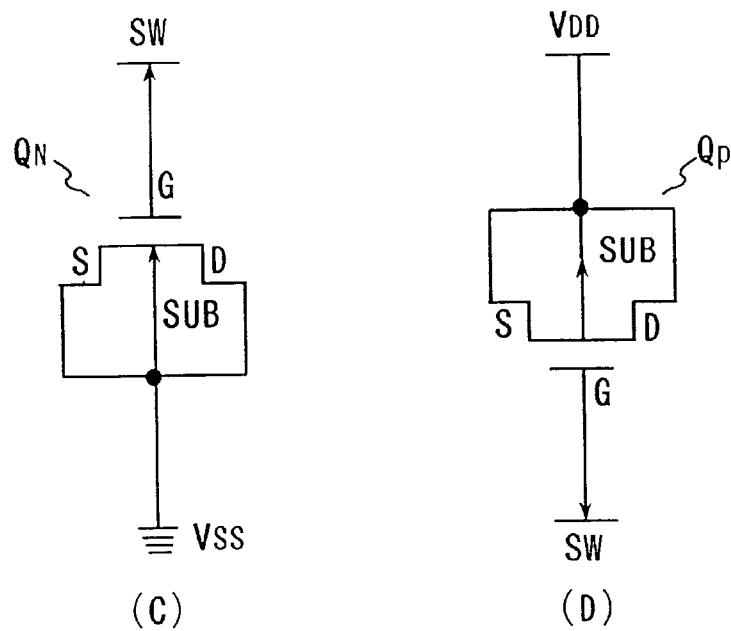

FIG. 24 shows examples of the capacitors C10, C12, C14, C16, C18, and C20 of FIGS. 20 and 22. FIG. 24(A) shows an example of the capacitor of the N-type FET Qn. The voltage Vss is applied to the gate G and the substrate SUB, and the switch SW switches the drain D and the source S to the output of the delay element DL. FIG. 24(B) shows an example of the capacitor of the P-type FET Qp. The voltage Vdd is applied to the gate G and the substrate SUB, and the switch SW switches the drain D and the source S to the output of the delay element DL. FIG. 24(C) shows an example of the capacitor of the N-type FET Qn. The voltage Vss is applied to the drain D, the source S, and the substrate SUB, and the switch SW is connected to the gate G. FIG. 24(D) shows an example of the capacitor of the P-type FET Qp. The voltage Vdd is applied to the drain D, the source S, and the substrate SUB, and the switch SW is connected to the gate G.

In FIGS. 24(A) and (B), the gates G of the P-type FET Qp and the N-type FET Qn are insulated from the channels by the gate oxidation film. The drain D and the source S are insulated from the substrate SUB by virtue of the fact that they are inversely biased with respect to the substrate SUB. Accordingly, the capacitors can be constructed using FET circuits. In FIGS. 24(C) and (D), the gates G of the P-type FET Qp and the N-type FET Qn are connected to the switch SW, in which the electric charge is stored when the transmission signal inversely biases the gate G.

Figure 25:
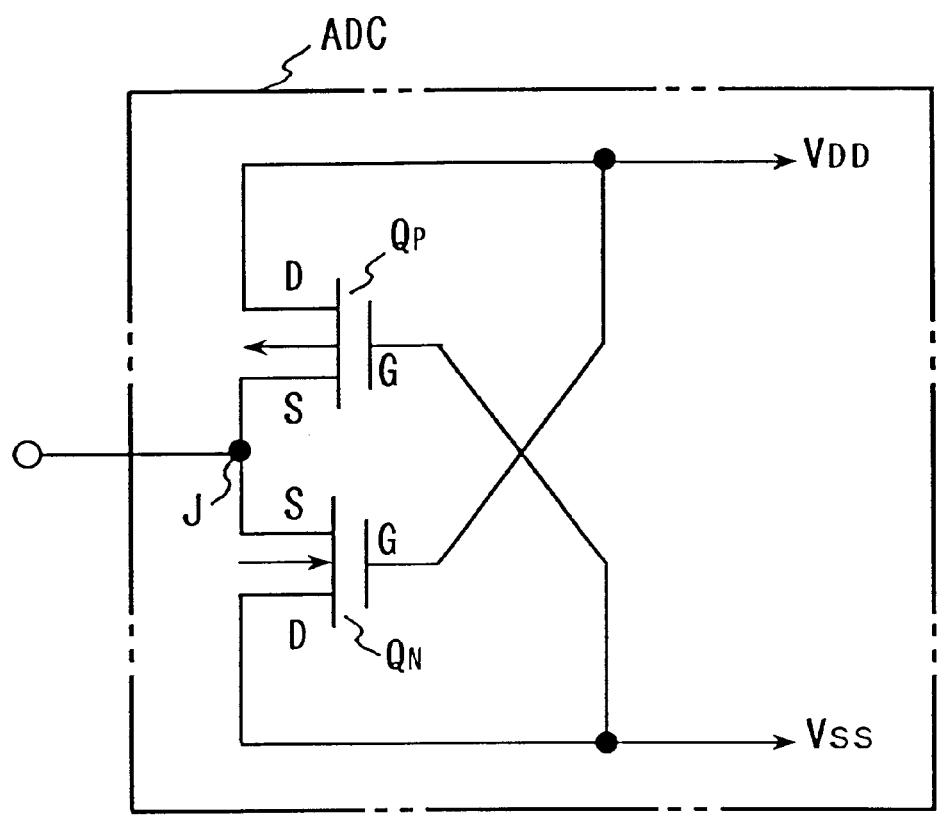
FIG. 25 shows a configuration of the addition circuit ADC.
Figure 26:
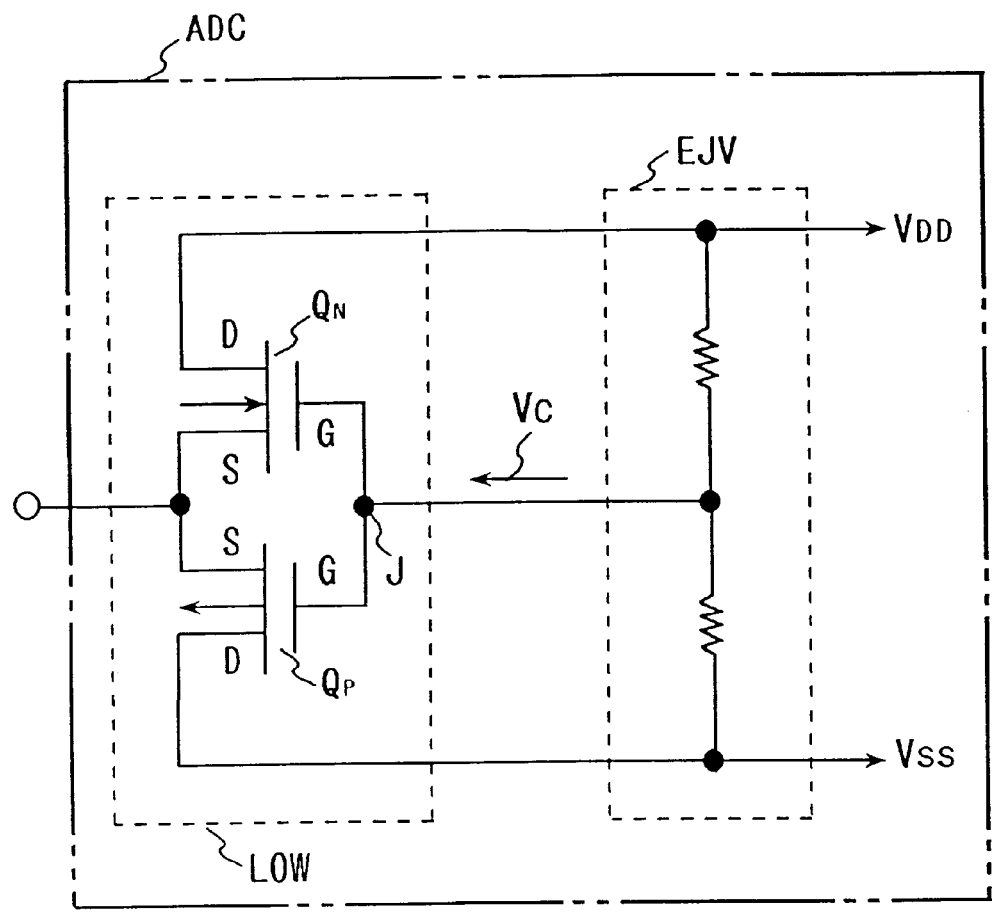
FIG. 26 shows another configuration of the addition circuit ADC.

FIGS. 25 and 26 show the improvement of the addition circuit ADC. As shown in FIG. 25, the addition circuit ADC directly provides the forward bias voltage for the gate G of the P-type FET Qp and the N-type FET Qn. This enables maintenance of a turned on state for the P-type FET Qp and the N-type FET Qn. This keeps the voltage at the common intersection point J at approximately the midway voltage Vc with the impedance low.

FIG. 26 shows the addition circuit ADC that includes a low impedance buffer circuit LOW and a midpoint voltage source EJV. In the low impedance buffer circuit LOW, the voltage Vdd is applied to the drain D of the N-type FET Qn; the voltage Vss is applied to the drain D of the P-type FET Qp; the gates G thereof are connected; the sources S thereof are connected; and the midway voltage Vc is applied from the midpoint voltage source EJV to the common intersection point J of the gate G.

Figure 27:
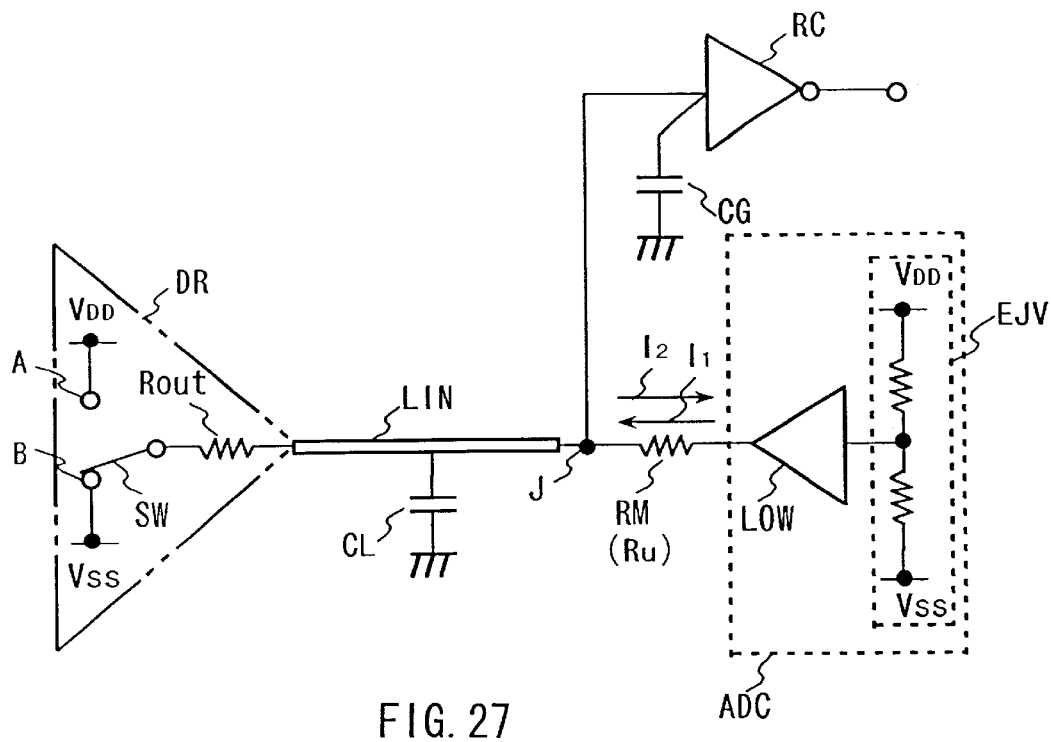
FIG. 27 shows the configuration equivalent to that of FIG. 26.

FIG. 27 shows an equivalent circuit of the addition circuit ADC of FIG. 26. It is possible to regard this as a voltage buffer where gain=1, the N-type FET Qn and the P-type FET Qp that constitute the low impedance buffer circuit LOW of FIG. 26. The addition circuit ADC incorporates a low impedance buffer circuit LOW as the midpoint voltage source EJV. Once the drive circuit DR outputs a Low signal, the current I1 flows from the equivalent resist circuit RM to the signal line LIN. The voltage of the common intersection point J is slightly reduced from the midway voltage Vc. At this time, the receipt circuit RC outputs a High signal. Alternatively, once the drive circuit DR outputs the High signal, the current I2 flows from the signal line LIN to the addition circuit ADC. The flowing of the current I2 slightly increases the voltage at the common intersection point J from the midway voltage Vc. The receipt circuit RC outputs a Low signal as a result. The resistor Ru of the equivalent resist circuit RM is small with respect to the output impedance Rout of the drive circuit DR, where Rout>>Ru. This aids in reducing the change in the voltage at the common intersection point J which decreases the change in the voltage.

Figure 28:
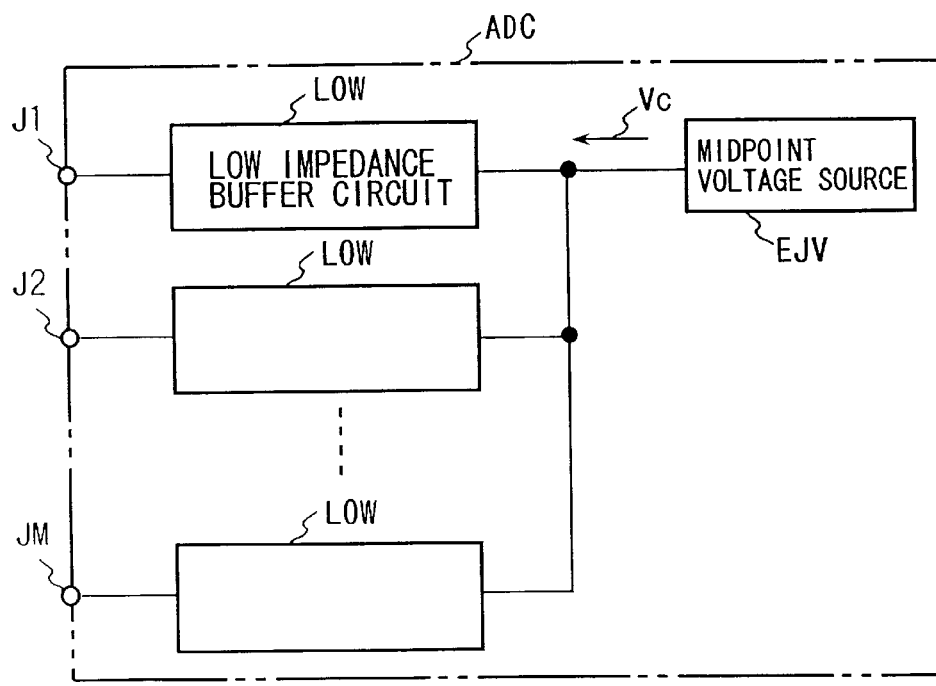
FIG. 28 shows other configuration of the addition circuit

FIG. 28 shows another addition circuit ADC employing the midpoint voltage source EJV. In an addition circuit ADC having the midpoint voltage source EJV and a plurality of low impedance buffer circuits LOW, it is possible to give the midway voltage Vc to the low impedance buffer circuits LOW. It is also possible to connect the addition circuit ADC to a plurality of signal lines LIN.

The electricity consumption is almost zero when the delay device D10 has the CMOS circuit in a static state. Accordingly, to inspect the delay device D10, this static current is measured. Whether or not the measured current is below a specific value is examined. If the addition circuit ADC is incorporated in the delay device D10, the addition circuit ADC consumes electricity regardless of being in static state or not. Consequently, the delay device D10 in which the addition circuit ADC is incorporated is not suitable for static current measurement.

In FIGS. 29–32, to solve the problems explained above, the cutting circuit CUT is added to the addition circuit ADC. The current that flows in the addition circuit ADC is cut for the static current measurement as necessary by providing a control signal to the cutting circuit CUT.

Figure 29:
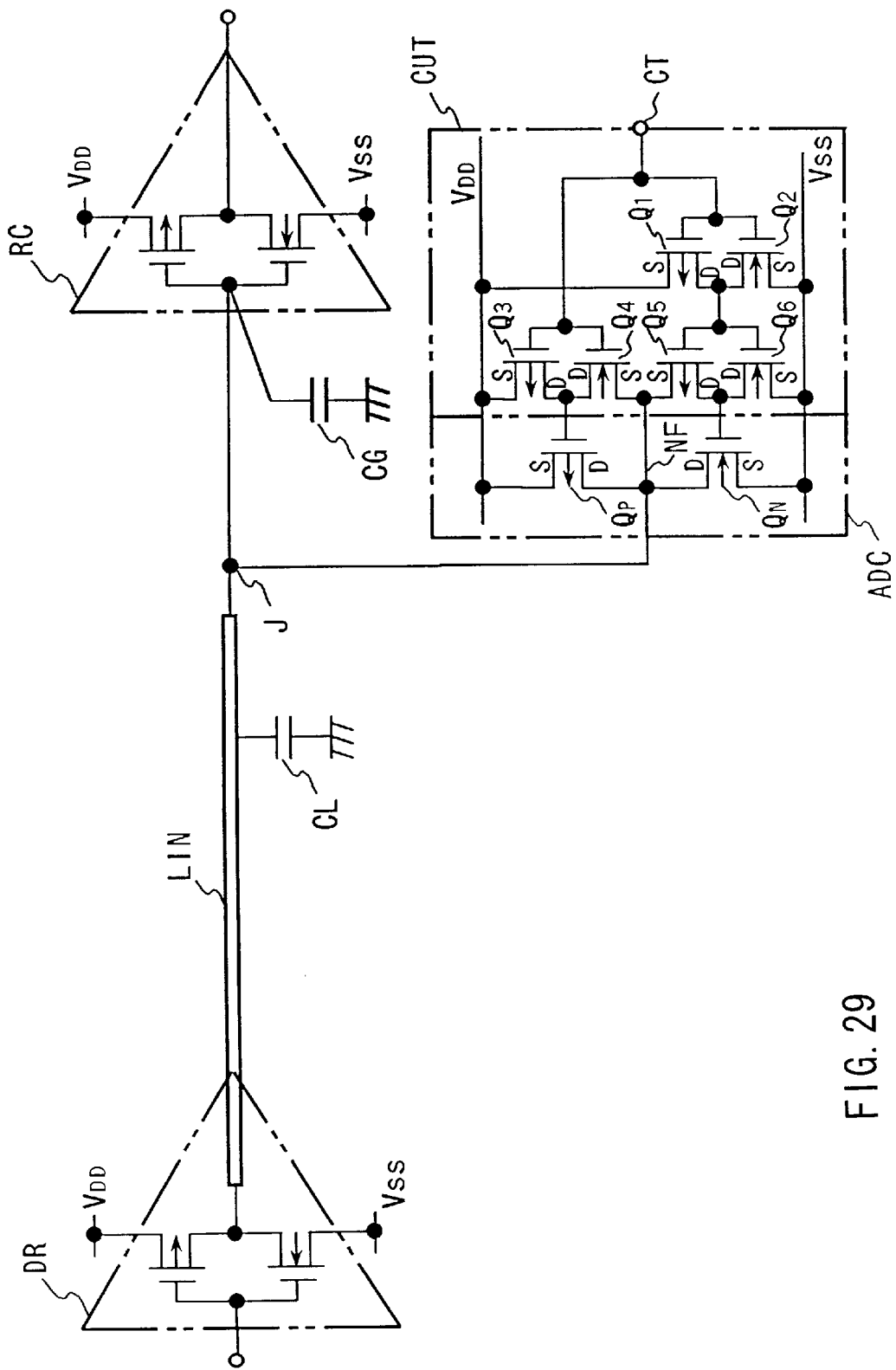
FIG. 29 shows the addition circuit ADC provided with the cutting circuit CUT.

FIG. 29 shows the addition circuit ADC provided with the cutting circuit CUT. The cutting circuit CUT incorporates a control terminal CT. Once the control terminal CT is fed with a High signal, the addition circuit ADC is turned on. When the control terminal CT is fed with a Low signal, the addition circuit ADC is turned off, thus consuming no electric power. That is, provision of a High signal to the control terminal CT turns off the FET Q1 and Q3 and turns on the FET Q2 and Q4. Since the FET Q2 is turned on and the FET Q1 is turned off, it corresponds that the FET Q5 is turned on and the FET Q6 is turned off. Consequently, the FET Q4 and Q5 are turned on. The addition circuit ADC operates with the gates G of the FET Qp and FET Qn being connected to each other via the FET Q4 and Q5.

Giving a Low signal to the control terminal CT, causes the FET Q1 and Q3 to turn on while the FET Q2 and Q4 are turned off. Since the FET Q1 and FET Q2 are turned off, the FET Q5 is turned off and the FET Q6 is turned on. That is, since the FET Q4 and Q5 are turned off and the FET Q3 and Q6 are turned on, the FET Qp and Qn are turned off. Here, even though the FET Q1, Q3, and Q6 are turned on, the FET Q2, Q4, and Q5 are turned off, so no current flows in the addition circuit ADC. Accordingly, providing a Low signal to the control terminal CT enables the static current measurement.

Figure 30:
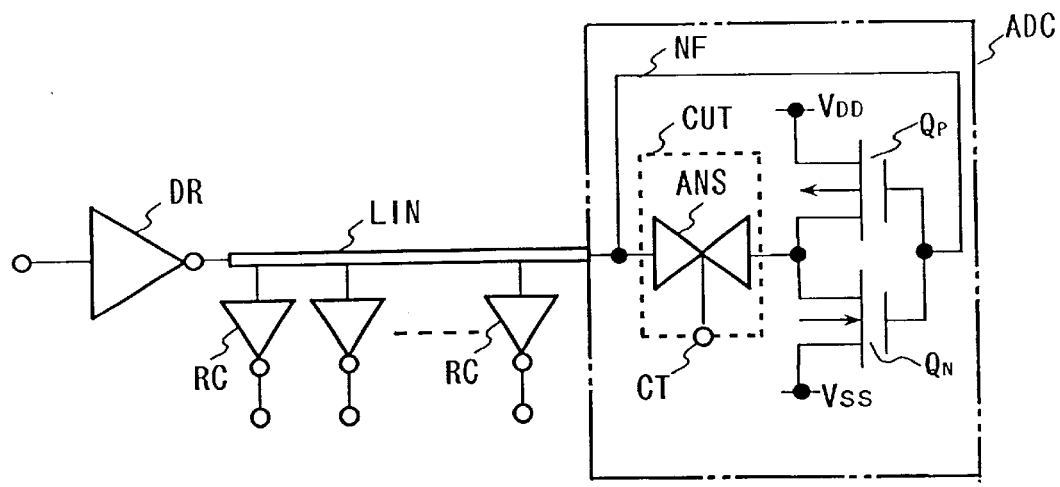
FIG. 30 shows the cutting circuit CUT provided with the switch element ANS.

FIG. 30 shows the cutting circuit CUT including a switch element ANS. This is generally called an analogue switch. Turning off the switch element ANS switches off the FET Qp and Qn.

Figure 31:
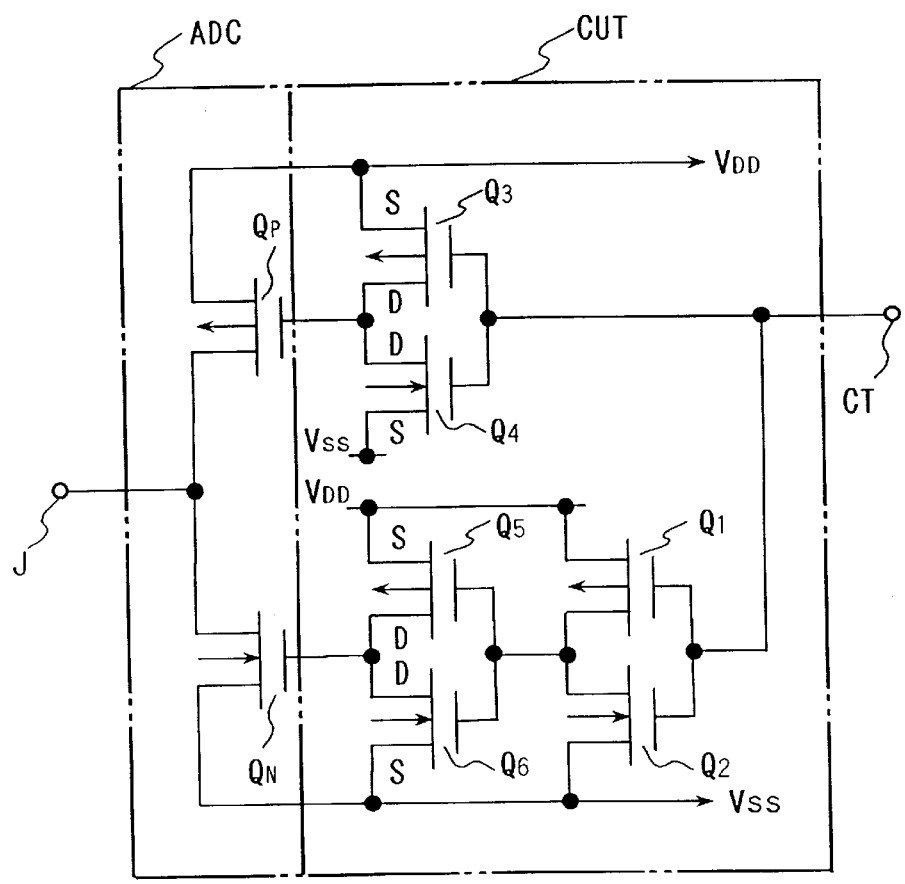
FIG. 31 shows the addition circuit ADC of FIG. 25 provided with the cutting circuit CUT.

FIG. 31 shows the addition circuit ADC of FIG. 25 provided with the cutting circuit CUT. Turning on the FET Q4 and Q5 by providing a High signal for the control terminal CT applies the forward bias voltage Vss and Vdd to the gates G of the P-type FET Qp and the N-type FET Qn. This turns on both the P-type FET Qp and the N-type FET Qn to allow them operate as the addition circuit ADC. Providing a Low signal for the control terminal CT turns off the FET Q4 and Q5 and turns on the FET Q3 and Q6. The result is the P-type FET Qp and the N-type FET Qn are turned off and consume no electric power.

Figure 32:
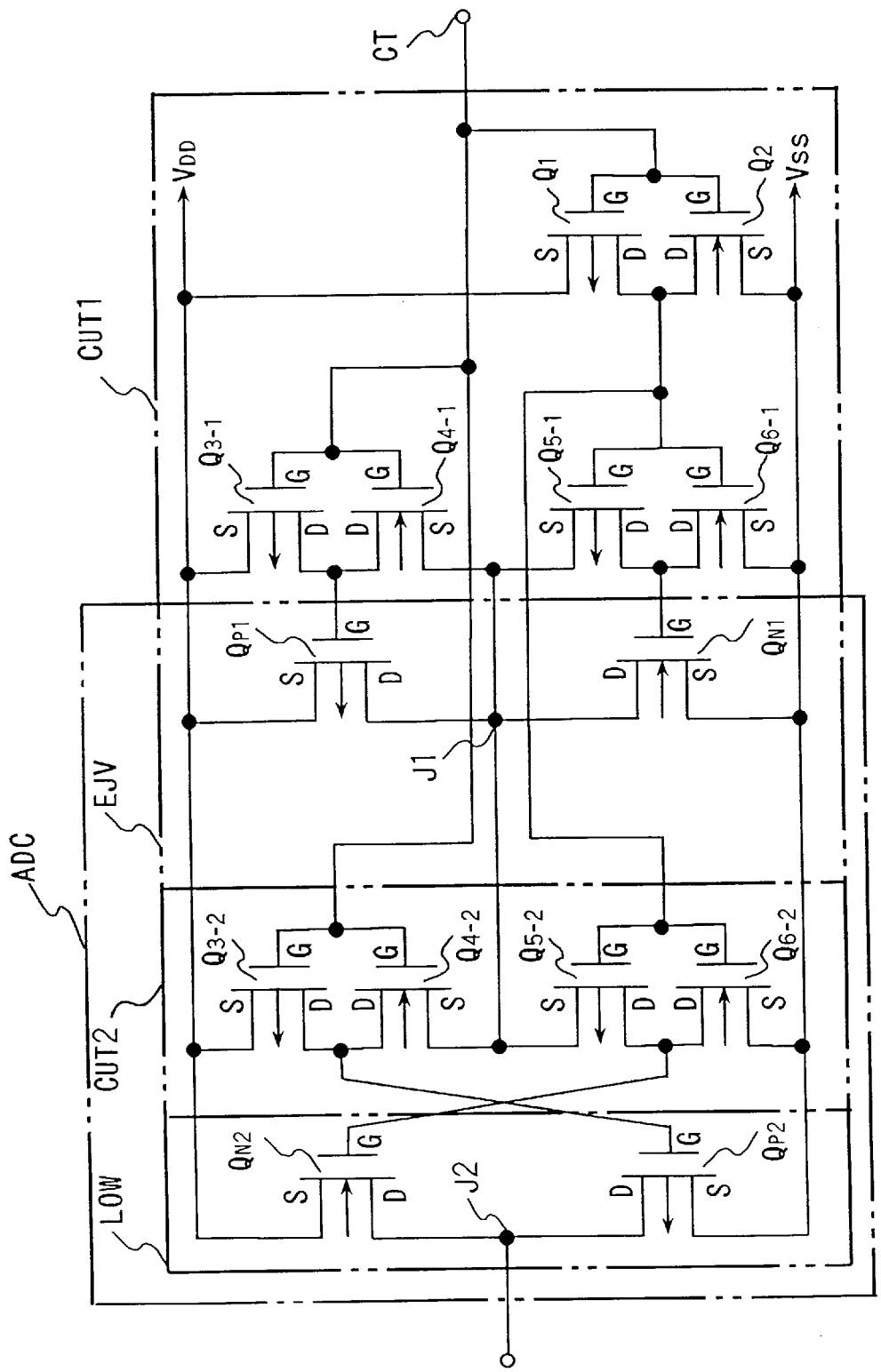
FIG. 32 shows the addition circuit ADC provided with the cutting circuit CUT that includes the low impedance buffer circuit LOW and the midpoint voltage source EJV.

FIG. 32 shows the addition circuit ADC provided with the cutting circuit CUT that includes low impedance buffer circuit LOW and a midpoint voltage source EJV. The addition circuit ADC of FIG. 10 is employed as the midpoint voltage source EJV. The cutting circuit CUT1 turns off the P-type FET Qp1 and the N-type FET Qn1 both of which constitute the midpoint voltage source EJV. The cutting circuit CUT2 turns off the P-type FET Qp2 and the N-type FET Qn2 both of which constitute the low impedance buffer circuit LOW. By providing a High signal for the control terminal CT, the FET Q4-1 and Q5-1 in the cutting circuit CUT 1 are turned on. This connects the gates G of the P-type FET Qp1 and the N-type FET Qn1 to each other via the FET Q4-1 and Q5-1. As a result, the midway voltage Vc is output to the intersection point J1.

In the, cutting circuit CUT2, the FET Q4-2 and Q5-2 are turned on. Consequently, the gates G of the N-type FET Qn2 and the P-type FET Qp2 are connected via the FET Q4-2 and FET Q5-2. The midway voltage Vc is given from the midpoint voltage source EJV to the common intersection point J2. In this case, the N-type FET Qn2 and the P-type FET Qp2 are configured similar to that of the low impedance buffer circuit LOW of FIG. 26; once the drive circuit DR provides a signal for the intersection point J2 they operate similar to the operation explained referring to FIG. 26. Providing a Low signal for the control terminal CT turns on the FET Q3-1 and Q6-1 and turns off the FET Q4-1 and QS-1. It corresponds that the N-type FET Qn2 and the P-type FET Qp2 are turned off. Accordingly, providing the Low signal to the control terminal CT completely cuts off the current, thus enabling the static current measurement.

In the above embodiments, the inverter INV is employed for the addition circuit ADC. Following are explanations for the addition circuit ADC comprising circuits other than the inverter INV, e.g. a NAND gate, or a NOR gate.

Figure 33:
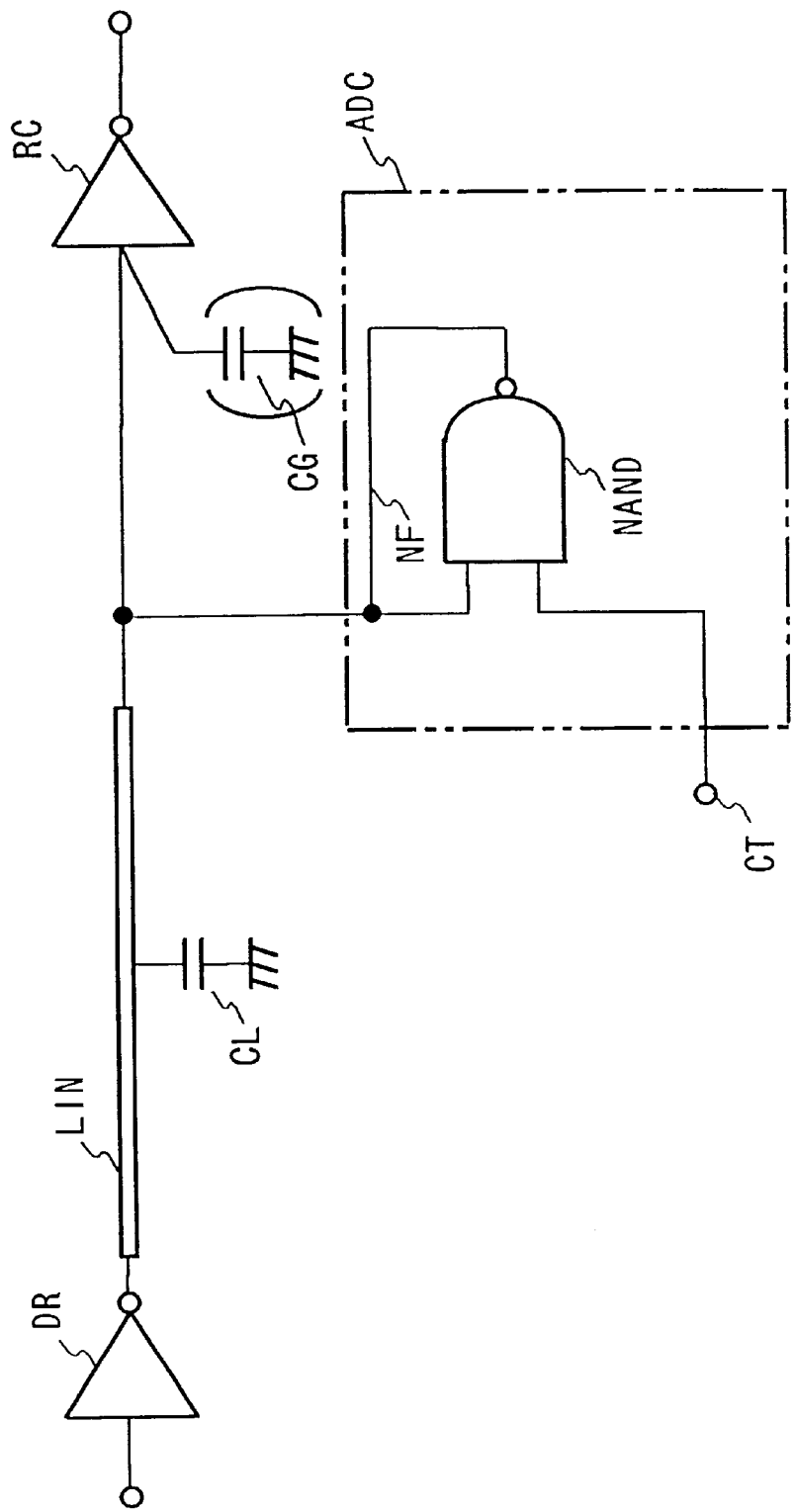
FIG. 33 shows another delay device D10.

FIG. 33 shows another the delay device D10 according to the present invention. The addition circuit ADC includes a NAND gate. Specifically, the NAND gate is connected to the feedback circuit NF. Since the NAND gate has at least two input terminals, one of them can be available for the control terminal CT.

Figure 34:
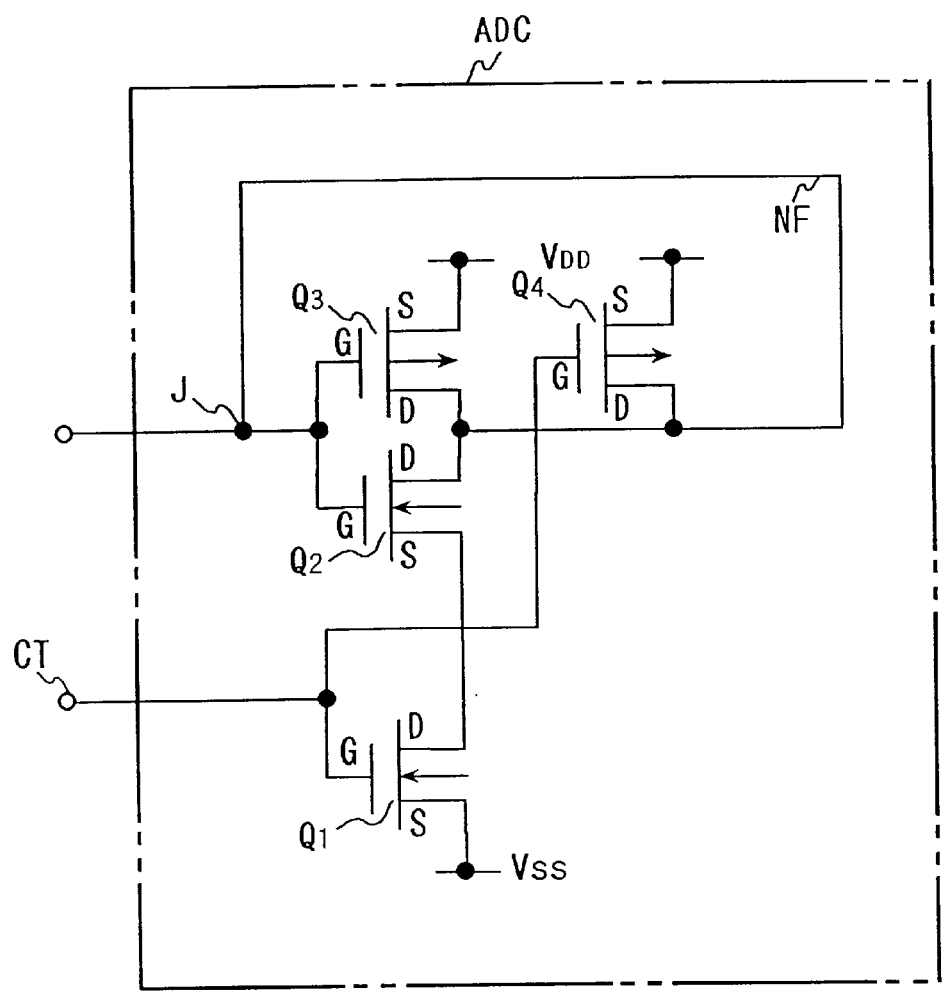
FIG. 34 shows the configuration of the addition circuit ADC employing the NAND gate.

FIG. 34 shows the configuration of the addition circuit ADC employing the NAND gate. Applying to the control terminal CT a High signal and a Low signal turns on/off the addition circuit ADC. Providing a High signal for the control terminal CT turns on the addition circuit ADC to output the midway voltage Vc; providing a Low signal therefore turns off the addition circuit ADC to output a High signal. Giving a High signal to the control terminal CT turns on the, FET Q1 and turns off the FET Q4. Accordingly, the addition circuit ADC operates with the drains D of the FET Q2 and Q3 being connected to each other to output the midway voltage Vc.

Alternatively, providing a Low signal to the control terminal CT turns off the FET Q1 and turns on the FET Q4. This renders the voltage at the common intersection point J High. The inspection of leak current in semiconductor integration circuits, that is, the static current inspection, requires that the output of the drive circuit DR be set to the equivalent voltage of the common intersection point J. Controlling the input signal for the control terminal CT can turn on/off the addition circuit ADC provided with the NAND gate.

Figure 35:
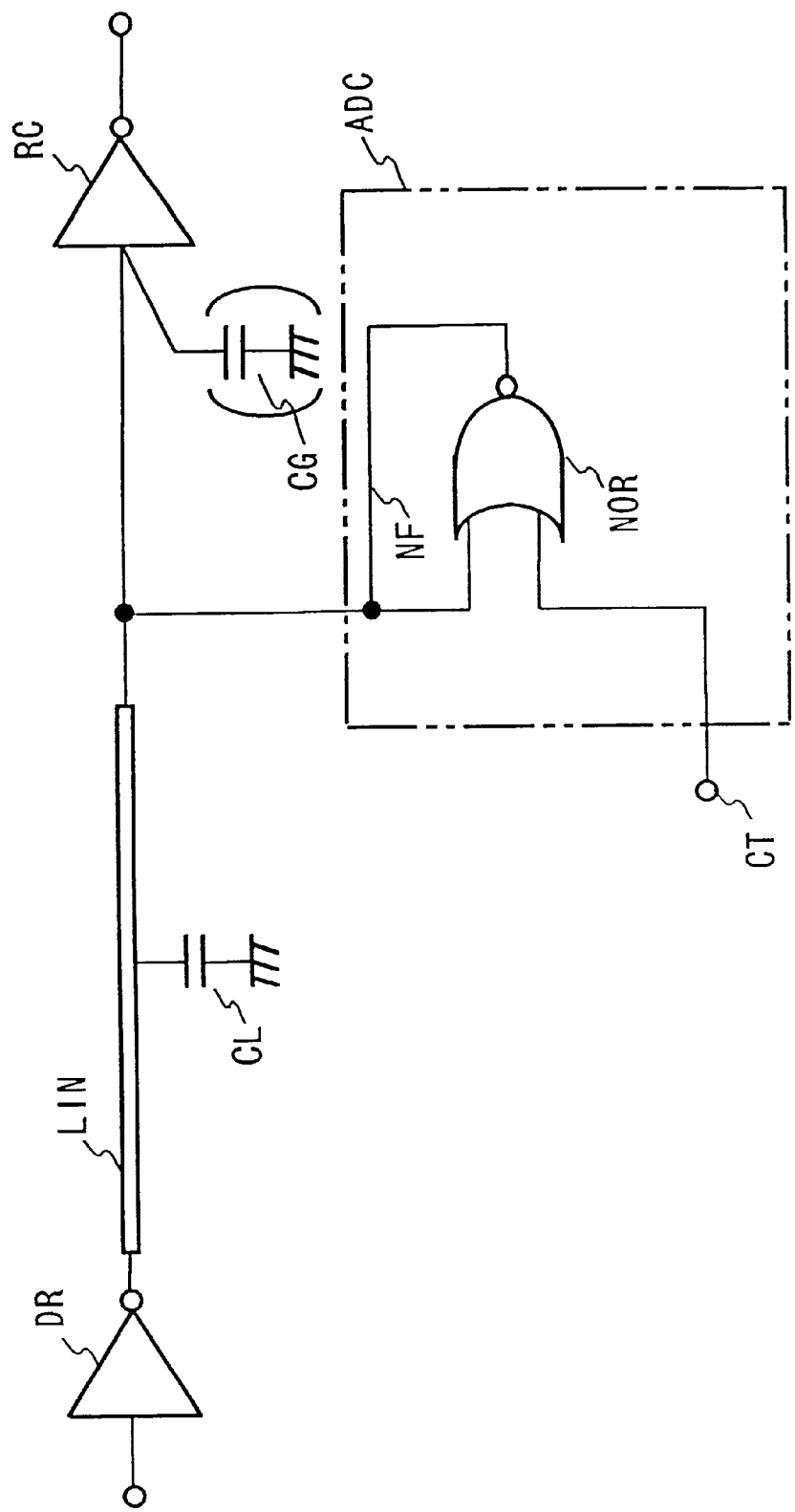
FIG. 35 shows further another delay device D10.

FIG. 35 shows further another delay device D10 according to this invention. The addition circuit ADC incorporates a NOR gate. Specifically, the addition circuit ADC has the NOR gate connected to the feedback circuit NF. Since the NOR gate includes at least two input terminals, one of them can be available as the control terminal CT.

Figure 36:
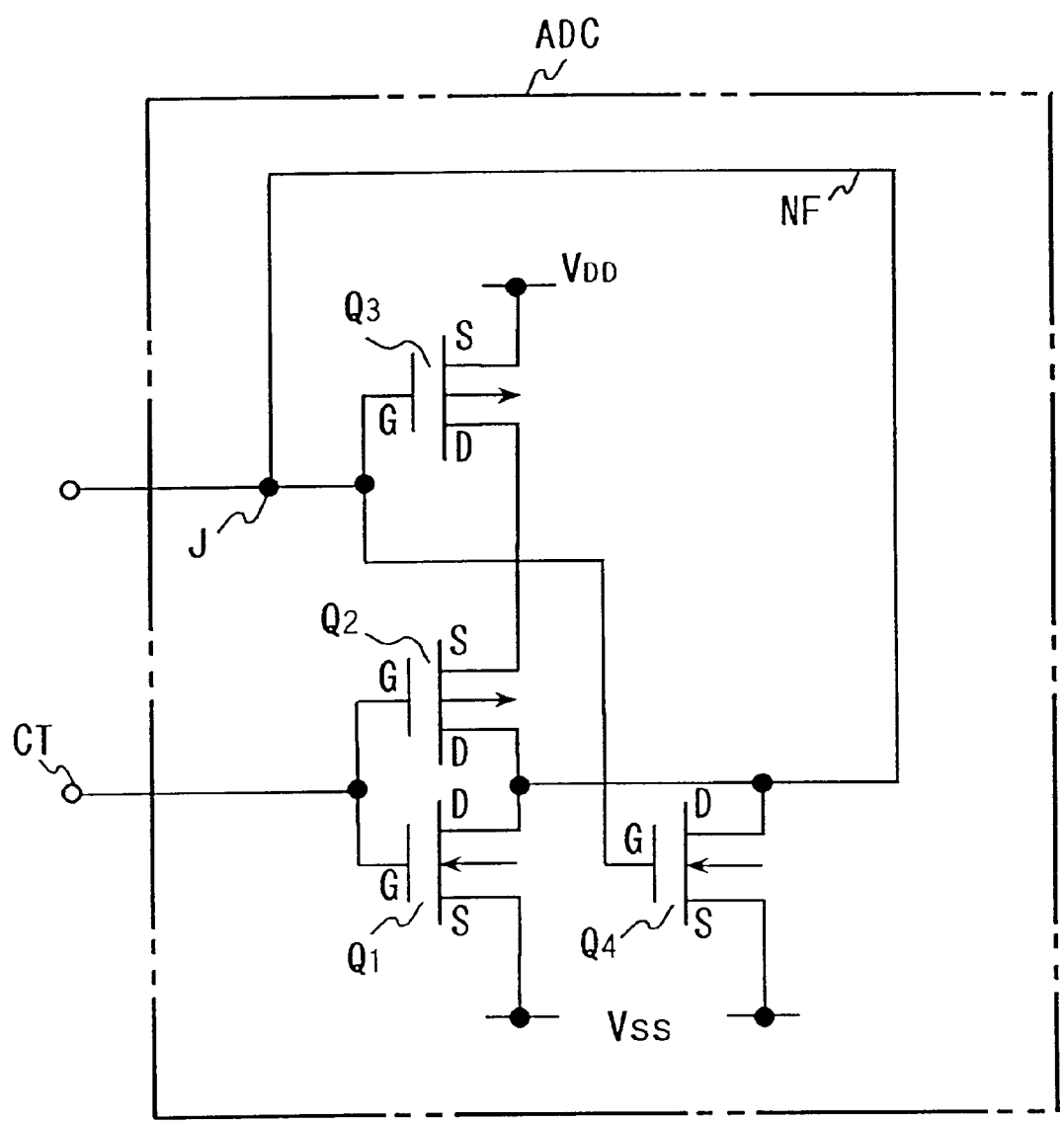
FIG. 36 shows an example of the addition circuit ADC provided with the NOR gate.

FIG. 36 shows an example of the addition circuit ADC provided with the NOR gate. Applying to the control terminal CT a High signal and a Low signal turns on/off the addition circuit ADC. Providing a Low signal for the control terminal CT turns on the addition circuit ADC to result in the output of the midway voltage Vc. Alternatively, providing a High signal for the control terminal CT turns off the addition circuit ADC to result in the output of a Low signal. Giving a Low signal to the control terminal CT turns off the FET Q1 and turns on the FET Q2. Since the drain D of the FET Q3 is connected to the source S of the FET Q2, and the FET Q2 is turned on, the drains D of the FET Q3 and Q4 are connected to each other to operate as the addition circuit ADC, thus outputting the midway voltage Vc.

On the contrary, giving a High signal to the control terminal TC turns on the FET Q1 and turns off the FET Q2. Since the FET Q1 is turned on, the voltage at the common intersection point J is Low. The inspection of leak current in semiconductor integration circuits, that is, the static current inspection requires that the output of the drive circuit DR be set to the equivalent voltage at the common intersection point J. Controlling the input signal for the control terminal CT can turn on/off the addition circuit ADC provided with the NOR gate.

Figure 37:
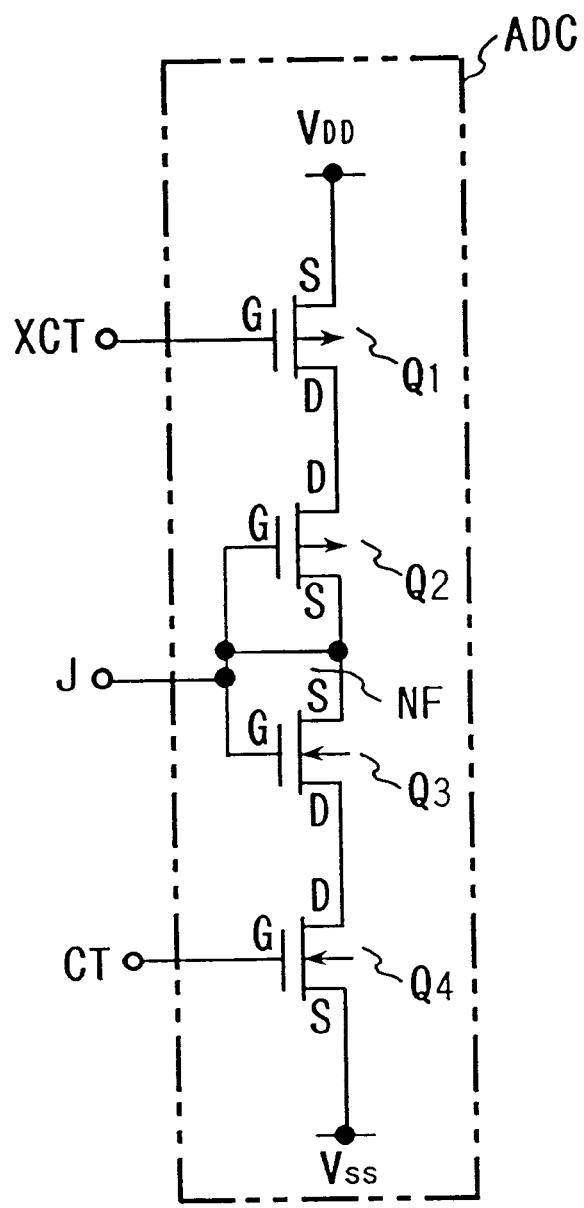
FIG. 37 shows still another addition circuit ADC.

FIG. 37 shows still another addition circuit ADC. The addition circuit ADC includes a control terminal CT and XCT as the cutting circuit CUT. Feeding a High signal to the control terminal CT and a Low signal to the control terminal XCT turns on the addition circuit ADC. Alternatively, feeding a Low signal to the control terminal CT and a High signal to the control terminal XCT turns off the addition circuit ADC, so no electric power is consumed. That is, providing a High signal to the control terminal CT and a Low signal to the control terminal XCT turns on the FET Q1 and Q4. This applies the voltage Vdd from the FET Q1 to the FET Q2 and the voltage Vss from the FET Q4 to the FET Q3. Accordingly, the midway voltage Vc is applied to the common intersection point J of the gates G of the FET Q2 and Q3. Giving a Low signal to the control terminal CT and a High signal to the control terminal XCT turns off the FET Q1 and Q4. Since neither the voltage Vdd nor the voltage Vss is applied to the FET Q1 and Q4, no current flows in the addition circuit ADC. Therefore, providing the Low signal to the control terminal CT and the High signal to the control terminal XCT enables measurement of the static current of the delay device D10.

Here, the midway voltage Vc is not limited to the center voltage between the voltage Vdd and the voltage Vss. The midway voltage Vc denotes an arbitrary voltage between the voltage Vdd and the voltage Vss in correspondence with the ratio. For example, in addition to the center voltage between the voltage Vdd and voltage Vss, the midway voltage source of FIG. 26 outputs a voltage corresponding to the threshold voltage of the receipt circuit RC.

Figure 38:
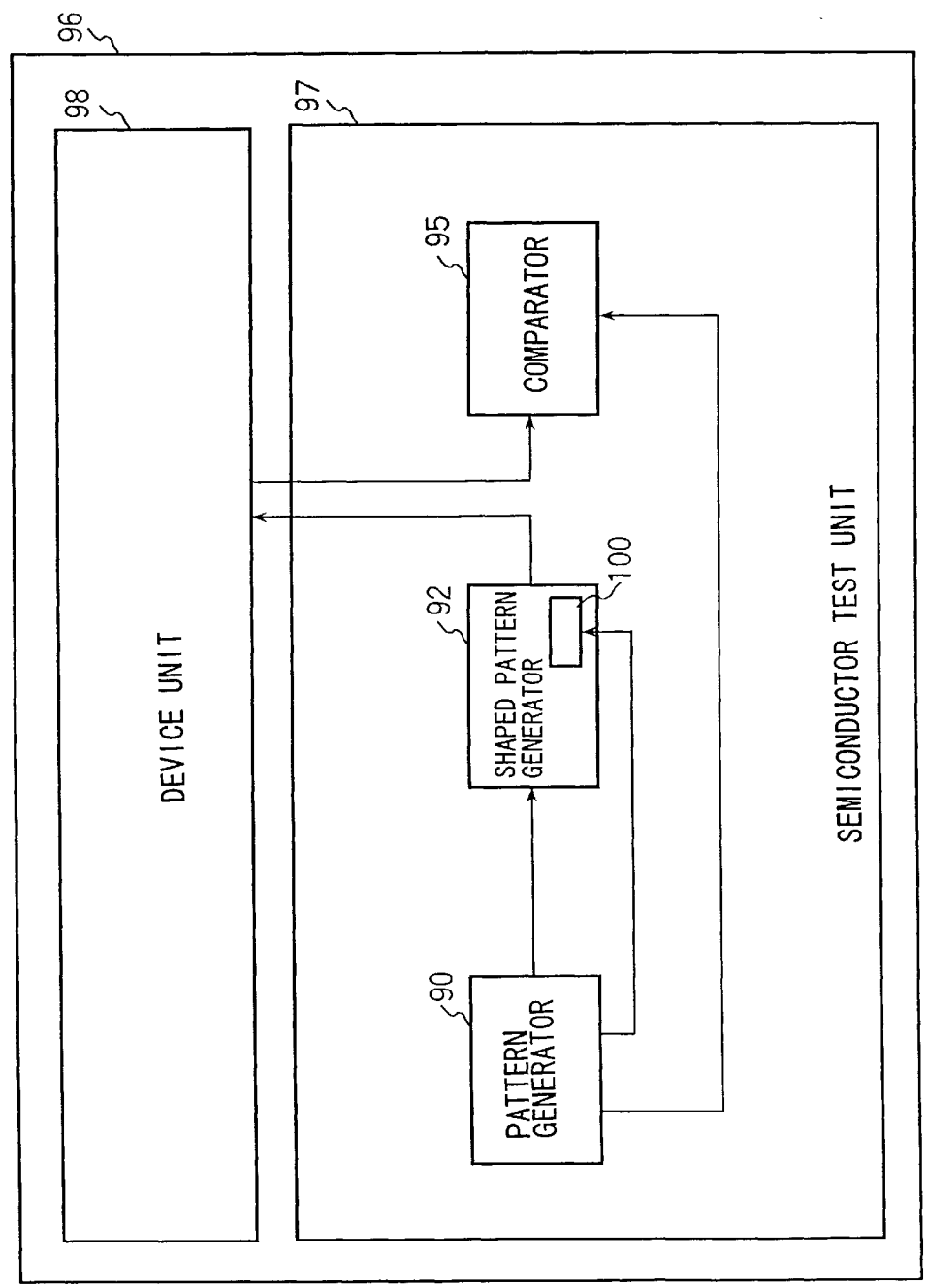
FIG. 38 shows the semiconductor device 96 including the semiconductor test unit 97 that inspects semiconductor devices.

FIG. 38 shows the semiconductor device 96 including the semiconductor test unit 97 which inspects semiconductor devices. The semiconductor device 96 incorporates the semiconductor test unit 97 and the device unit 98.

The semiconductor test unit 97 includes a pattern generator 90, a shaped pattern generator 92, and a comparator 95. The shaped pattern generator 92 has a delay circuit 100. The delay circuit is configured as shown in FIG. 26.

The pattern generator 90 generates test pattern data to be fed into the device unit 98, and an expectation pattern that the device unit 98 is expected to output in response to the pattern data. The pattern generator 90 outputs the pattern data to the shaped pattern generator 92 and the expectation data to the comparator 95. Further, the pattern generator 90 outputs a timing set signal to the delay circuit 100. The timing set signal instructs the delay circuit to generate a delay clock having a specified delay amount corresponding to the operation characteristic of the device unit 98.

The delay circuit 100 generates a delay clock with the delay amount specified by the timing set signal. The shaped pattern generator 92 shapes the pattern data based upon the delay clock provided by the delay circuit 100. This produces for the device unit 98 shaped pattern data corresponding to the operation characteristic thereof. In response to the shaped pattern data, the device unit 98 provides the comparator 95 with output data. The comparator 95 compares the expectation data and the output data to judge whether the device unit 98 is good or not. Employing the delay device D10 of FIGS. 7–37 for the delay circuit 100 enhances the accuracy of the delay time of the delay circuit 100 which in turn improves the accuracy of the examination of the semiconductor test unit 97.

Figure 39:
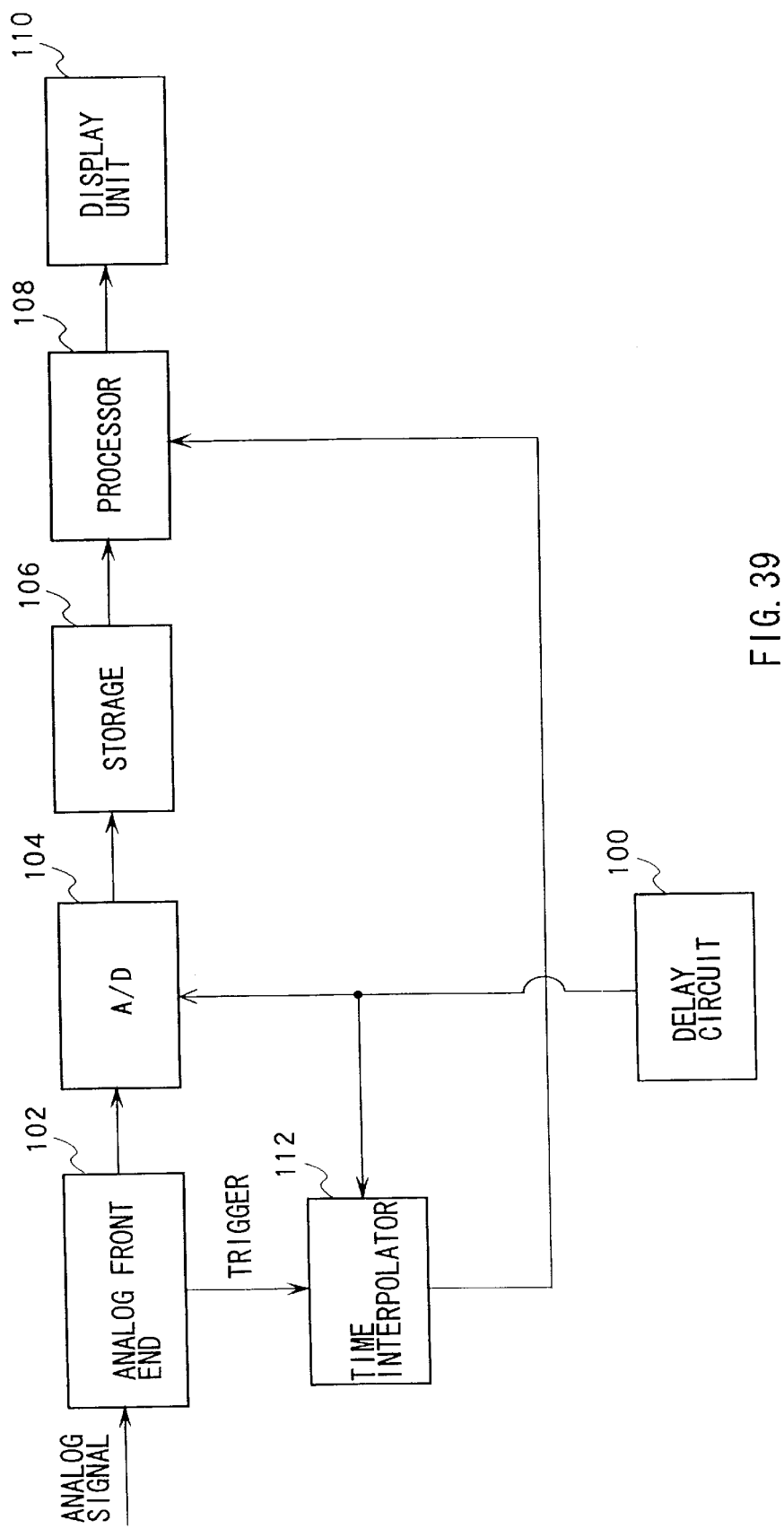
FIG. 39 shows the configuration of the oscilloscope.

FIG. 39 is a block diagram showing the oscilloscope. The oscilloscope incorporates the analog front end 102, the A/D convertor 104, the storage 106, the processor 108, the display unit 110, the time interpolator 112, and the delay circuit 100. The delay circuit 100 is configured as shown in FIG. 6.

The delay circuit 100 feeds the A/D convertor 104 and the time interpolator 112 the delay clock which has a given delay amount with respect to the reference clock. In response to the analog signal, the analog front end 102 outputs a trigger signal to the time interpolator 112. The analog front end 102 also outputs the analog signal to the A/D convertor 104. The A/D convertor 104 converts the incoming analog signal to a digital signal based upon the delay clock provided by the delay circuit 100. The digital signal is then output to the storage 106. The storage 106 stores the digital signal provided by the A/D convertor 104.

The time interpolator 112 measures the clock difference between the trigger signal provided by the analog front end 102 and the delay clock provided by the delay circuit 100. The time interpolator 112 then outputs the clock difference to the processor 108.

The processor 108 executes a process necessary for displaying the analog data based upon the data stored in the storage 106 and the clock difference provided by the time interpolator 112. The processor 108 then outputs the display data to the display unit 110. The display unit 110 displays the analog signal according to the display data provided by the processor 108. Employing the delay device D10 of FIGS. 7–37 for the delay circuit 100 improves the accuracy of the delay time, thereby enhancing the accuracy of the display of the oscilloscope.

While the present invention has been described in terms of the preferred embodiments, the invention is not limited thereto. The invention can be embodied in various ways without departing from the principle of the invention as defined in the appended claims.

As described above, in accordance with the preferred embodiments, connecting the addition circuit ADC to the delay element DL reduces the change in the power supply voltage for the delay device D10. The end result is enhancement of the accuracy of the delay time of the delay device D10. Further, as the power supply voltage changes, the midway voltage Vc output by the addition circuit ADC also alters. This alters proportional to the change in voltage to follow the threshold of the delay element DL, thus enabling the regular operation. The addition circuit ADC includes a ratio equivalent to the ratio of the delay element DL, and a feedback circuit NF. The addition circuit ADC can generate the voltage corresponding to the logical threshold of the delay element DL. Furthermore, the change in the power supply voltage is reduced, so the electromagnetic wave noise radiated from the delay device D10 is also reduced.

In accordance with the preferred embodiments, providing the cutting end terminal CUT in the circuit e.g. the addition circuit ADC and the midpoint voltage source EJV, enables cutting off of the current flowing in that circuit. Accordingly, it is possible to prevent the idling current from flowing in such a circuit that permits the idling current to flow in the static state. Consequently, it becomes easier to perform the static current measurement when inspecting a delay device D10 that includes the addition circuit ADC or the midpoint voltage source EJV. Further, applying the delay device D10 of the present invention to the delay circuit 100 enhances the accuracy of testing the semiconductor testing device including the delay circuit 100. The delay device D10 of the present invention also improves the accuracy of testing of the semiconductor device having the semiconductor testing unit 97 provided with the delay circuit 100, and the accuracy of the display of the oscilloscope having the delay circuit 100.

As described above, according to the present invention, reducing the change in the power supply voltage of the delay device can enhance the accuracy of the delay time of the delay device. This is therefore capable of reducing the electromagnetic wave noise radiated from the delay device D10.

What is claimed is:

1. A semiconductor testing device that tests a semiconductor device, comprising:
    a pattern generator that generates a test pattern to be fed into said semiconductor device;
    a delay unit that generates a delay clock having a delay amount corresponding to an operation characteristic of said semiconductor device;
    a shaped test pattern generator that generates a shaped test pattern by shaping said test pattern based upon said delay clock;
    a device insertion unit used for mounting said semiconductor device thereon and inputting said shaped test pattern to said semiconductor device; and
    a comparator that judges whether said semiconductor device is good or not based upon said output signal output by said semiconductor device in response to said shaped test pattern,
    wherein said delay unit includes
        a delay element that operates on two power supply voltages Vss and Vdd and that delays an input clock by said delay amount to generate said delay clock, said voltage Vss being smaller than said voltage Vdd, and
        an addition circuit that outputs a predetermined voltage that is larger than said voltage Vss and smaller than said voltage Vdd in response to said output of said delay element, wherein said addition circuit has an input terminal and an output terminal connecting with said input terminal.

2. A semiconductor testing device as set forth in claim 1, wherein
    said delay unit further includes a plurality of delay elements in series with each other; and
    a plurality of addition circuits each connected to one of outputs of said plurality of delay elements.

3. A semiconductor testing device as set forth in claim 1, wherein
    said delay element includes a digital circuit that outputs one of the output voltages of two possible values in correspondence with an input voltage, and
    said addition circuit outputs a voltage substantially similar to a threshold voltage that said output of said digital circuit inverts from one of said output voltages of said two possible values to another thereof.

4. A semiconductor device that includes a semiconductor testing unit that tests said semiconductor device, comprising:
    a semiconductor device unit; and
    a semiconductor testing unit that includes a delay unit that generates a generation timing of a test pattern used for testing said semiconductor testing unit,
    wherein said delay unit includes
        a delay element that operates on two voltages Vdd and Vss and generates said timing by delaying input clock, said voltage Vdd being larger than said voltage Vss; and
    an addition circuit that outputs a predetermined voltage that is larger than said voltage Vss and is smaller than said voltage Vdd in response to said output of said delay element, wherein said addition circuit has an input terminal and an output terminal connecting with said input terminal.

5. A semiconductor device as set forth in claim 4, wherein
    said delay unit further includes a plurality of delay elements in series with each other, and
    a plurality of addition circuits each connected to one of outputs of said plurality of delay elements.

6. A semiconductor device as set forth in claim 4, wherein
    said delay element includes a digital circuit that outputs one of output voltages of two possible values in correspondence with an input voltage, and
    said addition circuit outputs a voltage substantially similar to a threshold voltage that said output of said digital circuit inverts from one of said output voltages of two possible values to another thereof.

* * * * *